United States Patent
Liou et al.

(10) Patent No.: US 10,748,765 B2
(45) Date of Patent: Aug. 18, 2020

(54) MULTI-LAYER MASK AND METHOD OF FORMING SAME

(71) Applicant: Taiwan Semiconductor Manufacturing Company, Ltd., Hsinchu (TW)

(72) Inventors: Joung-Wei Liou, Zhudong (TW); Chin Kun Lan, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/663,501

(22) Filed: Oct. 25, 2019

(65) Prior Publication Data

US 2020/0176253 A1    Jun. 4, 2020

Related U.S. Application Data

(60) Provisional application No. 62/773,256, filed on Nov. 30, 2018.

(51) Int. Cl.
*H01L 21/033* (2006.01)
*H01L 21/02* (2006.01)

(52) U.S. Cl.
CPC ...... *H01L 21/0332* (2013.01); *H01L 21/0228* (2013.01); *H01L 21/02126* (2013.01); *H01L 21/02208* (2013.01); *H01L 21/02274* (2013.01); *H01L 21/02348* (2013.01)

(58) Field of Classification Search
None
See application file for complete search history.

(56) References Cited

U.S. PATENT DOCUMENTS

2003/0170993 A1*  9/2003  Nagahara .......... H01L 21/02063
                                                                 438/694

* cited by examiner

*Primary Examiner* — Jack S Chen
(74) *Attorney, Agent, or Firm* — Slater Matsil, LLP

(57) ABSTRACT

A method includes forming a multi-layer mask over a dielectric layer. Forming the multi-layer mask includes forming a bottom layer over the dielectric layer. A first middle layer is formed over the bottom layer. The first middle layer includes a first silicon-containing material. The first silicon-containing material has a first content of Si—$CH_3$ bonds. A second middle layer is formed over the first middle layer. The second middle layer includes a second silicon-containing material. The second silicon-containing material has a second content of Si—$CH_3$ bonds less than the first content of Si—$CH_3$ bonds.

20 Claims, 23 Drawing Sheets

MULTI-LAYER MASK AND METHOD OF FORMING SAME

PRIORITY CLAIM AND CROSS-REFERENCE

This application claims the benefit of U.S. Provisional Application No. 62/773,256, filed on Nov. 30, 2018, which application is hereby incorporated herein by reference.

BACKGROUND

The manufacturing of integrated circuits typically includes multiple photolithography processes. When the dimensions of the integrated circuits become increasingly smaller, the requirement for controlling the critical dimensions of the integrated circuits is also increasingly tightened. The critical dimensions are the minimum width of gate electrodes of the transistors in the wafer. The critical dimensions may be used as a reference for forming metal layers.

In conventional processes for controlling the critical dimensions (which is essentially controlling the sizes of the formed features), a tri-layer mask is formed on a wafer. The tri-layer mask includes a bottom layer, a middle layer over the bottom layer, and a photoresist over the middle layer. The photoresist is exposed using a photolithography mask, which includes opaque patterns and transparent patterns. The photoresist is then patterned through development. The patterned photoresist is used as an etching mask of the middle layer. The patterned middle layer is then used as an etching mask to etch the bottom layer. The patterned bottom layer is used as an etching mask to etch an underlying layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
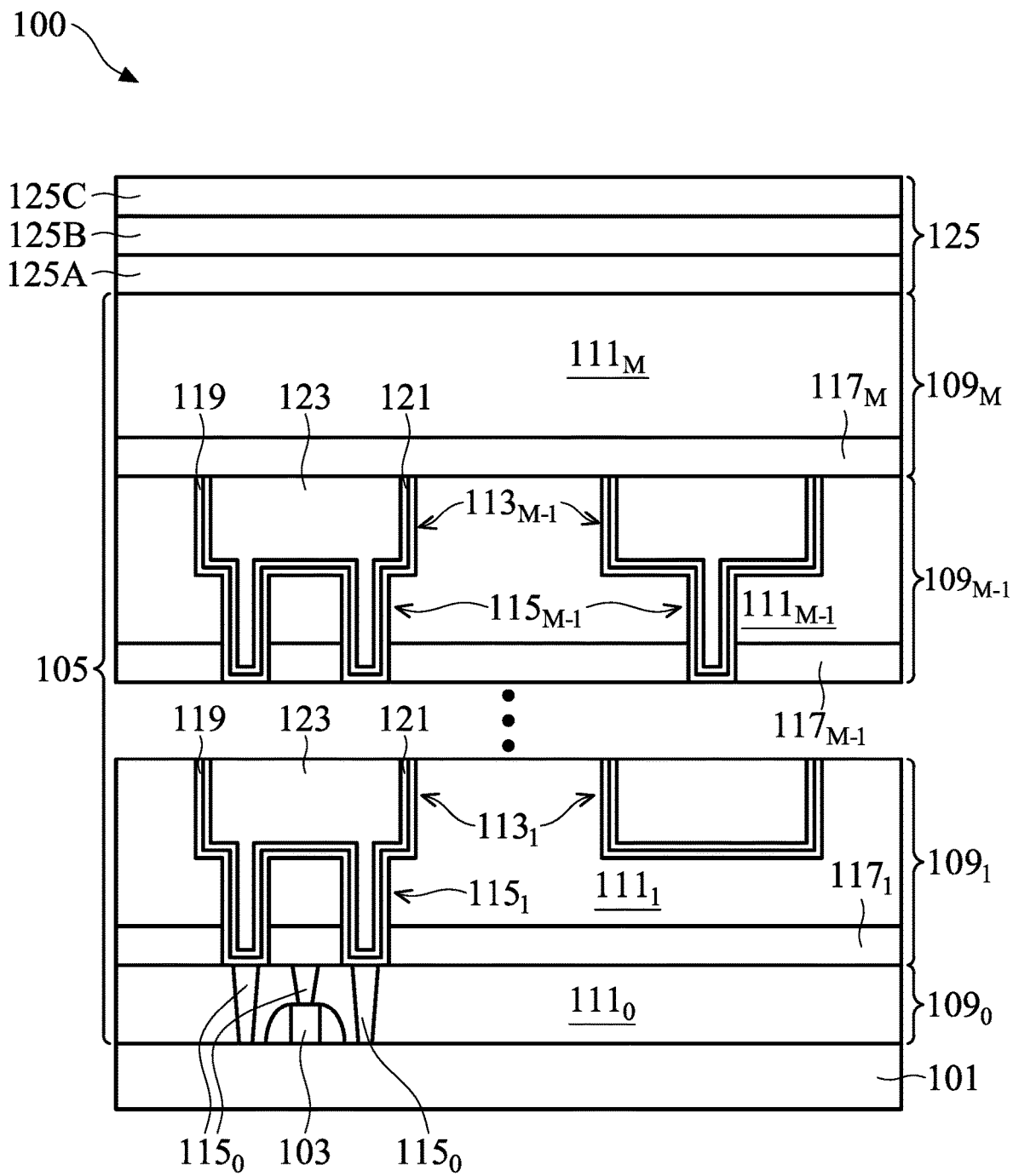
FIGS. 1-3 and 7-22 illustrate cross-sectional views of various intermediate stages of fabrication of a semiconductor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a multi-layer mask for a semiconductor structure and a method of forming the same. In particular, various embodiments describe a method of forming a middle layer of a multi-layer mask that has improved etch selectivity with respect to a bottom layer of the multi-layer mask. Furthermore, various embodiments describe a method of using such a multi-layer mask for forming conductive interconnects in a semiconductor device. However, a multi-layer mask described herein may also be used to form various structures of a semiconductor device, such as gates, various doped regions, contact plugs, or the like. Various embodiments allow for reducing over/under etching of the multi-layer mask due to loading difference, reducing formation of pattern bridges, improving profiles of patterned features of the multi-layer mask, improving a line-width roughness (LWR) of patterned features of the multi-layer mask, and reducing or avoiding formation wavy features in the multi-layer mask. Various embodiments further allow for forming conductive interconnects having low RC delays and improved leakage performance, which in turn improves wafer yield.

Referring to FIG. 1, a portion of a semiconductor structure 100 is illustrated. The semiconductor structure 100 may be an intermediate structure of an integrated circuit manufacturing process. In some embodiments, the semiconductor structure 100 may comprise a substrate 101. The substrate 101 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate 101 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

In some embodiments, one or more active and/or passive devices 103 (illustrated in FIG. 1 as a single transistor 103)

are formed on the substrate 101. The one or more active and/or passive devices 103 may include various devices, such as transistors, capacitors, resistors, diodes, photo-diodes, fuses, and the like. One of ordinary skill in the art will appreciate that the above examples are provided for the purpose of illustration only and are not meant to limit the present disclosure in any manner. Other circuitry may be also used as appropriate for a given application.

In some embodiments, an interconnect structure 105 is formed over the one or more active and/or passive devices 103 and the substrate 101. The interconnect structure 105 electrically interconnects the one or more active and/or passive devices 103 to form functional electrical circuits within the semiconductor structure 100. The interconnect structure 105 may comprise one or more metallization layers $109_0$ to $109_M$, wherein M+1 is the number of the one or more metallization layers $109_0$ to $109_M$. In some embodiments, the value of M may vary according to design specifications of the semiconductor structure 100. In some embodiments, the metallization layer $109_M$ may be an intermediate metallization layer of the interconnect structure 105. In such embodiments, further metallization layers are formed over the metallization layer $109_M$. In other embodiments, the metallization layer $109_M$ may be the final metallization layer of the interconnect structure 105.

In some embodiments, the one or more metallization layers $109_0$ to $109_M$, comprise one or more dielectric layers $111_0$ to $111_M$, respectively. The dielectric layer $111_0$ is an inter-layer dielectric (ILD) layer, and the dielectric layers $111_1$ to $111_M$ are inter-metal dielectric (IMD) layers. The ILD layer and the IMD layers may include low-k dielectric materials having k values, for example, lower than about 4.0 or even 2.0 disposed between such conductive features. In some embodiments, the ILD layer and IMD layers may be made of, for example, phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like, formed by any suitable method, such as spin-on coating, chemical vapor deposition (CVD), plasma-enhanced CVD (PECVD), atomic layer deposition (ALD), a combination thereof, or the like.

In some embodiments, etch stop layers (ESLs) $117_1$ to $117_M$ are formed between adjacent ones of the dielectric layers $111_0$ to $111_M$. A material for the etch stop layers is chosen such that etch rates of the etch stop layers are less then etch rates of corresponding ones of the dielectric layers $111_0$ to $111_M$. In some embodiments, an etch rate of the ESL $117_K$ is less than an etch rate of the dielectric layer $111_K$ (with K=1, . . . , M). In some embodiments, each of the ESLs $117_1$ to $117_M$ may comprise one or more layers of dielectric materials. Suitable dielectric materials may include oxides (such as silicon oxide, aluminum oxide, or the like), nitrides (such as SiN, or the like), oxynitrides (such as SiON, or the like), oxycarbides (such as SiOC, or the like), carbonitrides (such as SiCN, or the like), carbides (such as SiC, or the like), combinations thereof, or the like, and may be formed using spin-on coating, CVD, PECVD, ALD, a combination thereof, or the like.

In some embodiments, the metallization layer $109_0$ further comprises conductive plugs $115_0$ within the dielectric layer $111_0$, and the metallization layers $109_1$ to $109_{M-1}$ further comprise one or more conductive interconnects, such as conductive lines $113_1$ to $113_{M-1}$ and conductive vias $115_1$ to $115_{M-1}$, within the dielectric layers $111_1$ to $111_{M-1}$, respectively. The conductive plugs $115_0$ electrically couple the one or more active and/or passive devices 103 (e.g., a gate, a source and a drain of the transistor 103) to the conductive lines $113_1$ to $113_{M-1}$ and the conductive vias $115_1$ to $115_{M-1}$. As described below in greater detail, conductive lines $113_M$ and conductive vias $115_M$ (not illustrated in FIG. 1, see FIG. 22) are formed in the dielectric layer $111_M$.

In some embodiments, the conductive plugs $115_0$, the conductive lines $113_1$ to $113_{M-1}$ and the conductive vias $115_1$ to $115_{M-1}$ may be formed using any suitable method, such as a damascene method, a dual damascene method, or the like. In some embodiments, the steps for forming the conductive plugs $115_0$, the conductive lines $113_1$ to $113_{M-1}$ and the conductive vias $115_1$ to $115_{M-1}$ include forming openings in the respective dielectric layers $111_0$ to $111_{M-1}$, depositing one or more barrier/adhesion layers 119 (not shown in the conductive plugs $115_0$) in the openings, depositing seed layers 121 (not shown in the conductive plugs $115_0$) over the one or more barrier/adhesion layers 119, and filling the openings with a conductive material 123 (not shown in the conductive plugs $115_0$). A chemical mechanical polishing (CMP) is then performed to remove excess materials of the one or more barrier/adhesion layers 119, the seed layers 121, and the conductive material 123 overfilling the openings.

In some embodiments, the one or more barrier/adhesion layers 119 may comprise titanium, titanium nitride, tantalum, tantalum nitride, a combination thereof, or the like, and may be formed using PVD, CVD, ALD, a combination thereof, or the like. The one or more barrier/adhesion layers 119 protect the respective dielectric layers $111_0$ to $111_{M-1}$ from diffusion and metallic poisoning. The seed layers 121 may comprise copper, titanium, nickel, gold, manganese, a combination thereof, or the like, and may be formed by ALD, CVD, PVD, sputtering, a combination thereof, or the like. The conductive material 123 may comprise copper, aluminum, tungsten, combinations thereof, alloys thereof, or the like, and may be formed using, for example, by plating, or other suitable methods.

Referring further to FIG. 1, a hard mask 125 is formed over the dielectric layer $111_M$. In some embodiments, the hard mask 125 comprises one or more mask layers. In the illustrated embodiment, the hard mask 125 comprises a first hard mask layer 125A, a second hard mask layer 125B over the first hard mask layer 125A, and a third hard mask layer 125C over the second hard mask layer 125B. The first hard mask layer 125A may be an anti-reflective coating (ARC) layer such as a nitrogen free ARC (NFARC) layer, or the like, and may be formed using CVD, ALD, or the like. In some embodiments, a thickness of the first hard mask layer 125A may be between about 50 Å and about 500 Å. The second hard mask layer 125B may comprise a nitride, such as silicon nitride (SiN), titanium nitride (TiN), tantalum nitride (TaN), or the like, and may be formed using CVD, ALD, or the like. In some embodiment, a thickness of the second hard mask layer 125B may be between about 50 Å and about 1000 Å. The third hard mask layer 125C may comprise an oxide, such as silicon oxide, or the like, and may be formed using CVD, ALD, or the like. In some embodiment, a thickness of the third hard mask layer 125C may be between about 50 Å and about 1000 Å.

Figure 2:
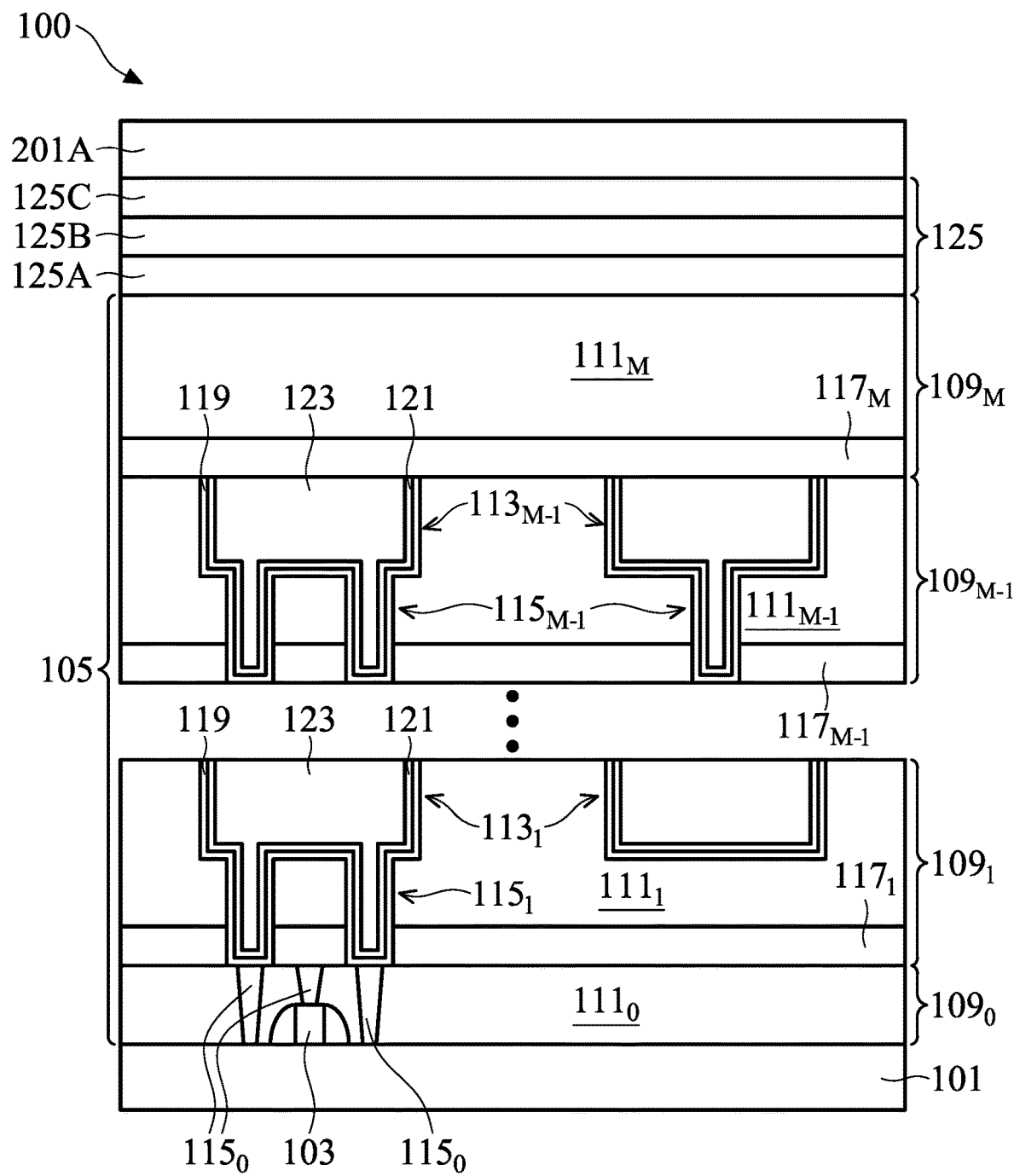
Figure 3:
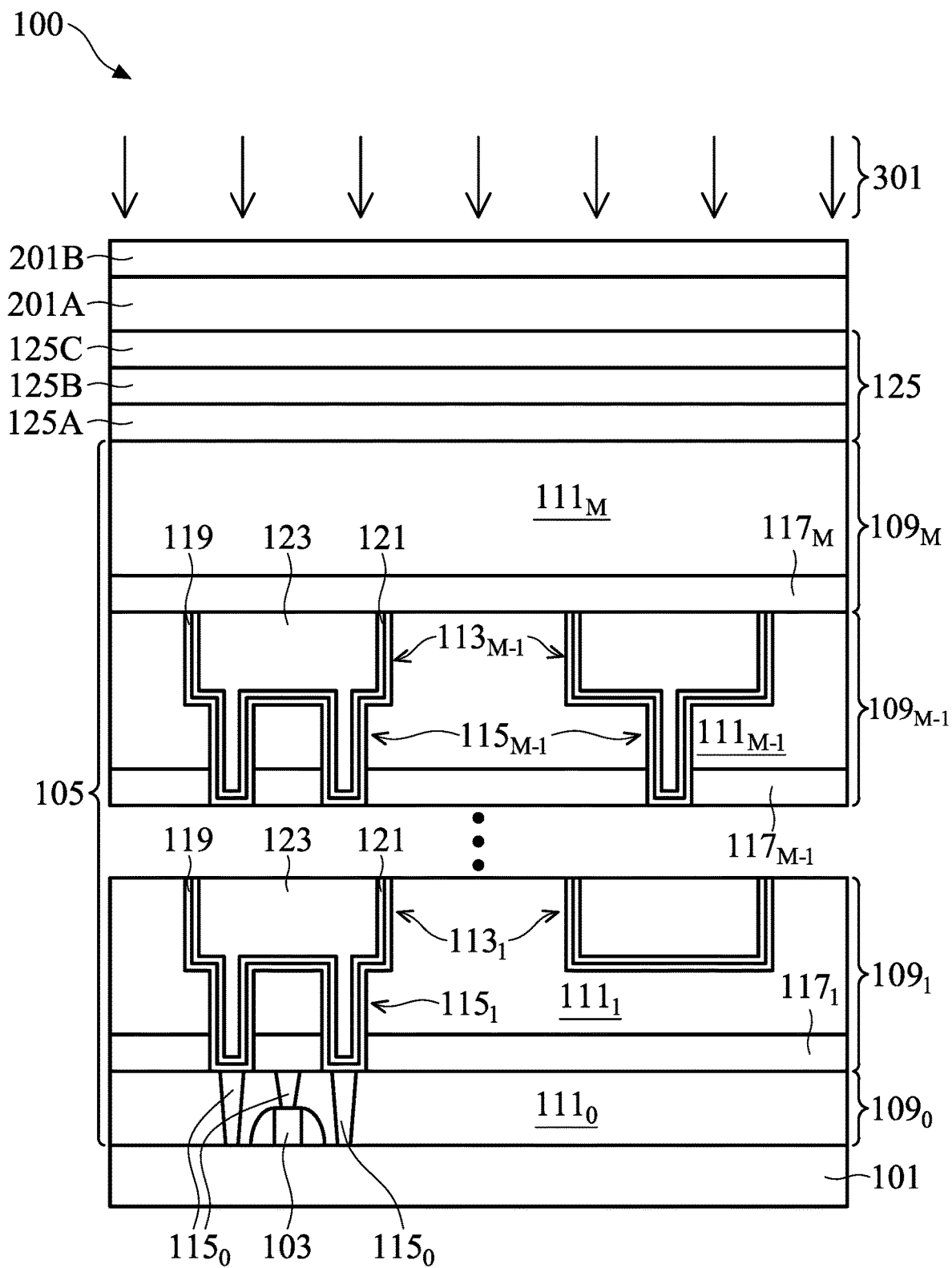
Figure 7:
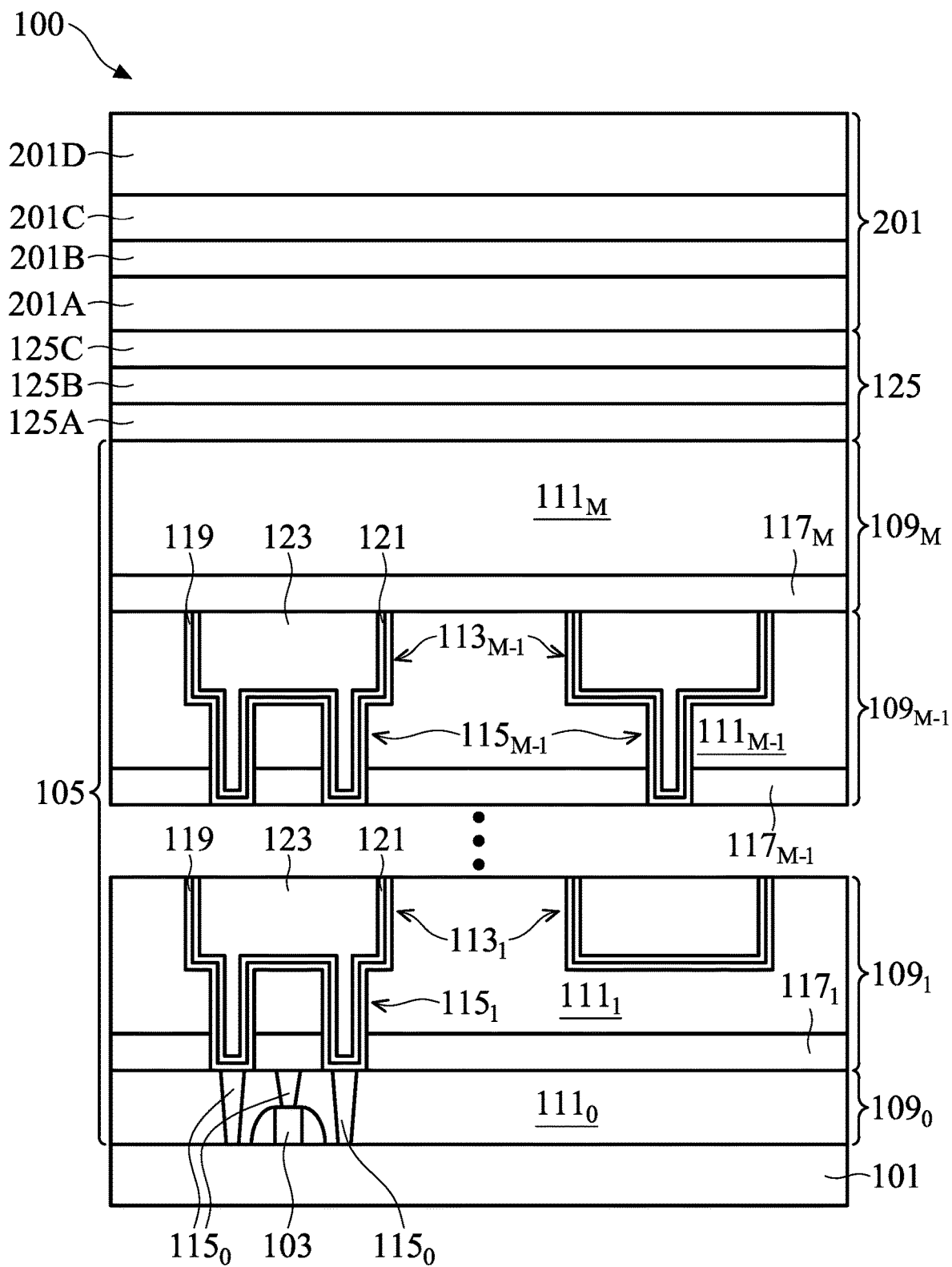

Referring to FIGS. 2, 3 and 7, a multi-layer mask 201 is formed over the hard mask 125. In some embodiments, the multi-layer mask 201 comprises a bottom layer 201A, a first middle layer 201B over the bottom layer 201A, a second middle layer 201C over the first middle layer 201B, and a top layer 201D over the second middle layer 201C. Referring first to FIG. 2, the bottom layer 201A of the multi-layer mask 201 is formed over the hard mask 125. In some embodiments, the bottom layer 201A may comprise a material comprising elements C, H, O, or N, a photoresist material formed using a spin-on method, a spin-on carbon (SOC) material, an amorphous carbon (a-C) material formed using CVD, or the like. In some embodiment, a thickness of the bottom layer 201A is between about 50 Å and about 2000 Å.

Referring to FIG. 3, after forming the bottom layer 201A over the hard mask 125, the first middle layer 201B is formed over the bottom layer 201A. The first middle layer 201B may comprise a silicon-containing material, such as silicon oxide, silicon oxycarbide (SiOC), or the like, and may be formed using spin-on, CVD, ALD, or the like. In some embodiments, a thickness of the first middle layer 201B is between about 50 Å and about 500 Å. In some embodiments, to improve an etch selectivity between the bottom layer 201A and the first middle layer 201B, the first middle layer 201B may be formed of a SiOC material with a high content of Si—$CH_3$ bonds. In some embodiments, such a SiOC material comprises a Si—O—Si backbone (matrix) and further includes Si—O and Si—C bonds. In some embodiments, a content of Si—$CH_3$ bonds in the SiOC material is between about 0.5% to about 15%. Such a range of the content of Si—$CH_3$ bonds allows for forming the SiOC material having sufficient mechanical strength. If the content of Si—$CH_3$ bonds in the SiOC material is greater than about 15%, the mechanical strength of the SiOC material is reduced because the Si—$CH_3$ bonds of such an excessive amount cannot crosslink with Si—O—Si matrix.

In some embodiments, the SiOC material with the high content of Si—$CH_3$ bonds may be formed using a plasma-enhanced CVD (PECVD) process using suitable precursors and reaction gases. In some embodiments, to increase the content Si—$CH_3$ bonds in the SiOC material, silicon-containing precursors with $C_xH_y$ groups incorporated therein may be used. In some embodiments, silicon-containing precursors may comprise $Si(CH_3)_4$, $Si(CH_3)_3H$, $Si(OC_2H_5)_4$, $C_5H_{13}O_2Si$, or the like. In other embodiments, to increase the content Si—$CH_3$ bonds in the SiOC material, separate $C_xH_y$ precursors, such as $C_2H_2$, $C_3H_8$, $C_2H_6$, $C_6H_6$, or the like, may be used in addition to suitable silicon-containing precursors. In some embodiments, $O_2$ or $N_2O$ may be used as reaction gases. In some embodiments where the silicon-containing precursor is $Si(CH_3)_4$ and the $C_xH_y$ precursor is $C_2H_2$, a ratio of a flow rate of $C_2H_2$ to a flow rate of $Si(CH_3)_4$ is between about 0.2 and about 0.6, such as about ⅓. In some embodiments, the PECVD process may be performed at a temperature between about 50° C. to about 200° C., and a pressure between about 0.5 Torr and about 20 Torr. If the temperature of the PECVD process is less than about 50° C., the SiOC material deposition time is increased (or alternatively, deposition efficiency is reduced), which adversely affects a wafer-per-hour yield. If the temperature of the PECVD process is greater than about 200° C., such a high process temperature will damage the bottom layer 201A. If the pressure of the PECVD process is less than about 0.5 Torr, the temperature of the wafer during the PECVD process cannot be controlled well. If the pressure of the PECVD process is greater than about 20 Torr, such a high process pressure will cause the increase of the wafer temperature to an undesirable value.

In some embodiments, the SiOC material with the high content of Si—$CH_3$ bonds may be formed using ALD using suitable precursors and reaction gases. In some embodiments, to increase the content Si—$CH_3$ bonds in the SiOC material, silicon-containing precursors with $C_xH_y$ groups incorporated therein may be used. In some embodiments, silicon-containing precursors may comprise $Si(CH_3)_4$, $SiH_2$ [$N(C_2H_5)_2]_2$, or the like. In other embodiments, to increase the content Si—$CH_3$ bonds in the SiOC material, separate $C_xH_y$ precursors, such as $C_2H_2$, $C_3H_8$, $C_2H_6$, $C_6H_6$, or the like, may be used in addition to suitable silicon-containing precursors. In some embodiments, $O_2$, $N_2O$, Ar, $N_2$, He, $H_2$ may be used as reaction gases. In some embodiments, plasma is added during the reaction step of the ALD process for a period between about 0.1 secs to 5 secs. By increasing the plasma time, a mechanical strength of the SiOC material is increased. However, the mechanical strength of the SiOC material saturates if the plasma time is greater than 5 secs. In some embodiments where the silicon-containing precursor is $Si(CH_3)_4$ and the $C_xH_y$ precursor is $C_2H_2$, a ratio of a flow rate of $C_2H_2$ to a flow rate of $Si(CH_3)_4$ is between about 0.2 and about 0.6, such as about ⅓.

Referring further to FIG. 3, in some embodiments, the first middle layer 201B formed of the SiOC material with the high content of Si—$CH_3$ may not have a desired hardness. In such embodiments, a UV treatment (depicted using arrows 301 in FIG. 3) is performed on the first middle layer 201B. In some embodiments, the UV treatment 301 may be performed using UV radiation having a wavelength between about 150 nm and 400 nm. In some embodiments, the UV treatment 301 may be performed at a temperature between about 10° C. and about 200° C. If the temperature of the UV treatment 301 is less than about 10° C., such a low temperature reduces a cure rate (or alternatively, a cross-linking rate) of the first middle layer 201B and adversely affects the wafer-per-hour yield. If the temperature of the UV treatment 301 is greater than about 200° C., such a high process temperature will damage the bottom layer 201A. In some embodiments, the UV treatment 301 may be performed in a gas atmosphere comprising $O_2$, Ar, He, NO, $N_2O$, $N_2O_2$, a combination thereof, or the like. In some embodiments, gases for the gas atmosphere may be chosen to have a high specific heat. Such gases allow for efficient heat removal from the wafer and avoiding overheating the wafer during the UV treatment 301. In some embodiments, the UV treatment 301 may be performed at a gas pressure between about 0.5 Torr and about 10 Torr. If the gas pressure is less than about 0.5 Torr, a heat transfer from the wafer to the gas atmosphere is reduced and the wafer temperature cannot be controlled well. If the gas pressure is greater than about 100 Torr, the heat transfer from the wafer to the gas atmosphere is increased, which may reduce the wafer temperature below a desired temperature. By reducing the wafer temperature, the cure rate (or alternatively, the cross-linking rate) of the first middle layer 201B is reduced, which adversely affects the wafer-per-hour yield. In some embodiments, by performing the UV treatment 301 and, consequently, increasing the hardness of the first middle layer 201B, the LWR of patterned features of the first middle layer 201B and the formation of wavy features in the first middle layer 201B may be reduced or avoided during a subsequent patterning process performed on the first middle layer 201B. In other embodiments, the UV treatment 301 may be omitted.

As described below in greater detail, a first etch process is performed on the first middle layer 201B to patterned the first middle layer 201B. Subsequently, a second etch process is performed on the bottom layer 201A to transfer a pattern of the patterned first middle layer 201B to the bottom layer 201A. In some embodiments, a material of the first middle layer 201B (e.g., the SiOC material with the high content of Si—$CH_3$) may be chosen to increase an etch rate of the first middle layer 201B during the first etch process while not significantly altering an etch rate of the first middle layer 201B during the second etch process.

Figure 4:
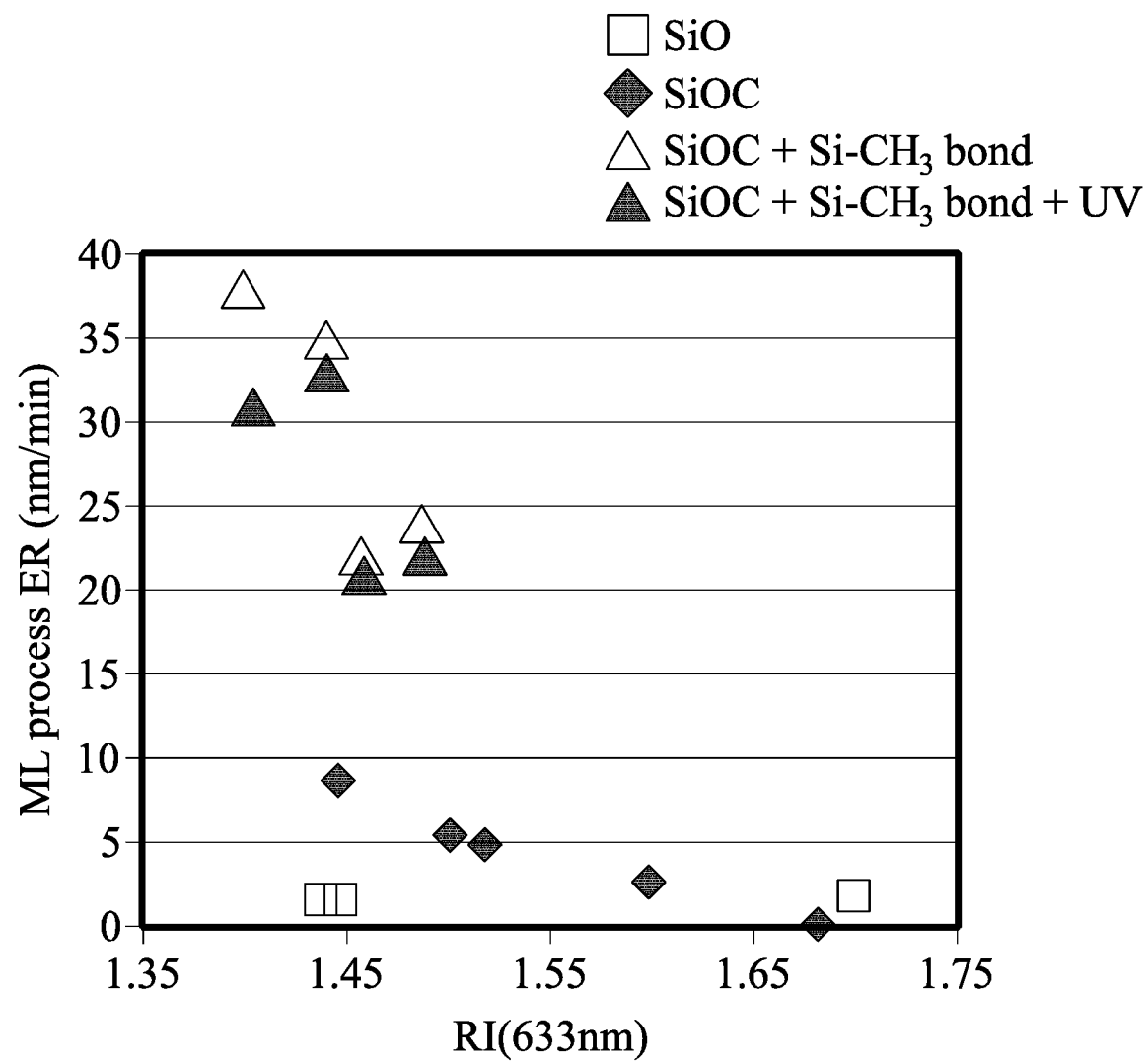
FIG. 4 illustrates etch rates of various materials in an etching process for patterning a middle layer of a multi-layer mask in accordance with some embodiments.

FIG. 4 illustrates etch rates of various candidate materials for the first middle layer 201B in an etching process for patterning the first middle layer 201B of the multi-layer mask 201 in accordance with some embodiments. Unfilled squares correspond to a SiO material, filled diamonds correspond to a SiOC material without added Si—CH$_3$ bonds and without performing a UV treatment, unfilled triangles correspond to a SiOC material with added Si—CH$_3$ bonds and without performing a UV treatment, and filled triangles correspond to a SiOC material with added Si—CH$_3$ bonds and with performing a UV treatment. The etch rates are illustrated as a function of a refractive index (RI) for light having a wavelength of about 633 nm. In some embodiments, different refractive indices of the same material correspond to different compositions of the same material. In some embodiments where the material comprises SiOC, different refractive indices correspond to different contents of carbon in SiOC. As shown in FIG. 4, by adding Si—CH$_3$ bonds to a SiOC material, the etch rate is increased. Furthermore, by performing a UV treatment (such as the UV treatment described with reference to FIG. 3) on a SiOC material with added Si—CH$_3$ bonds, the etch rate is not significantly decreased.

Figure 5:
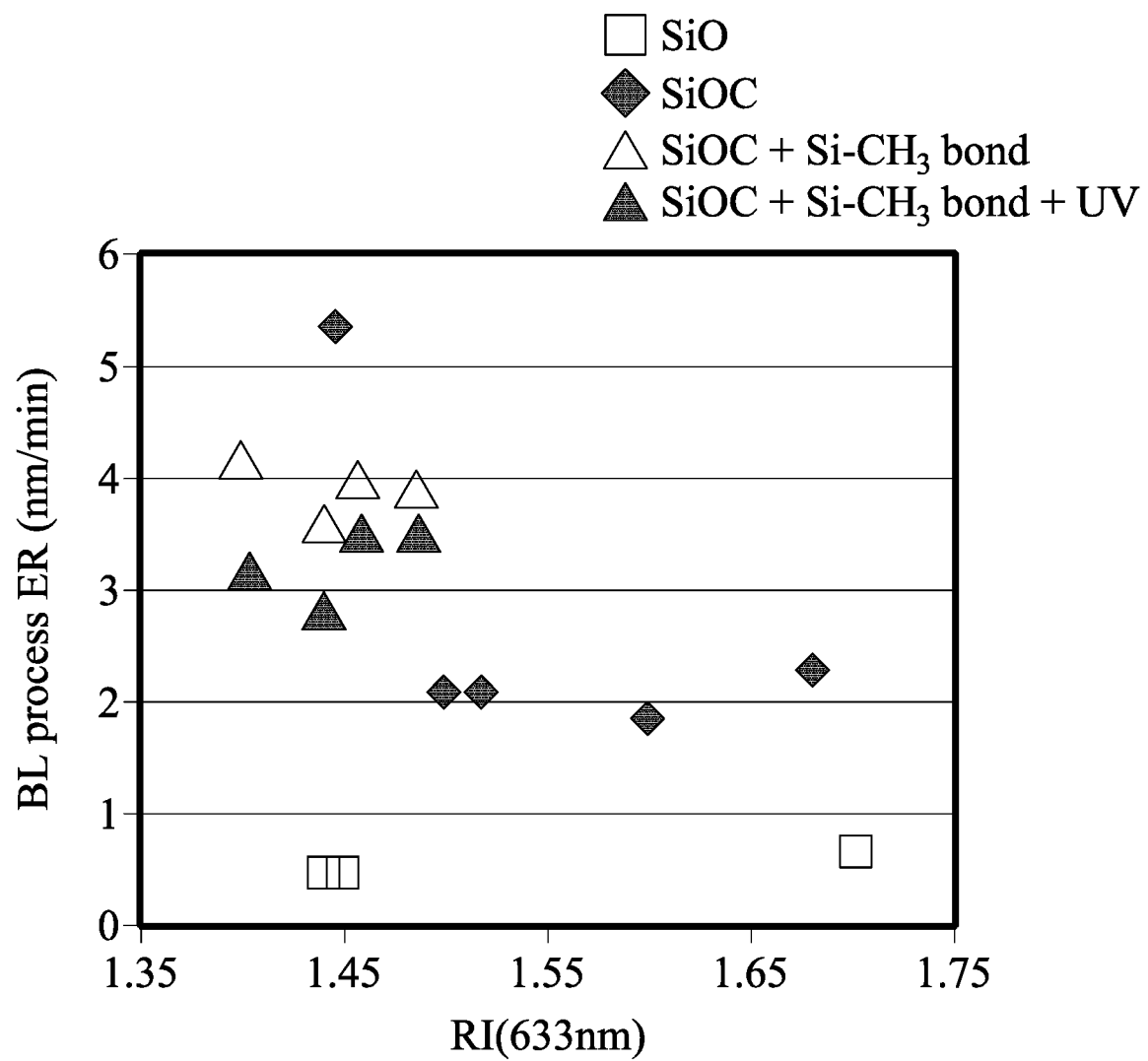
FIG. 5 illustrates etch rates of various materials in an etching process for patterning a bottom layer of a multi-layer mask in accordance with some embodiments.

FIG. 5 illustrates etch rates of various candidate materials for the first middle layer 201B in an etching process for patterning the bottom layer 201A of the multi-layer mask 201 in accordance with some embodiments. Unfilled squares correspond to a SiO material, filled diamonds correspond to a SiOC material without added Si—CH$_3$ bonds and without performing a UV treatment, unfilled triangles correspond to a SiOC material with added Si—CH$_3$ bonds and without performing a UV treatment, and filled triangles correspond to a SiOC material with added Si—CH$_3$ bonds and with performing a UV treatment. The etch rates are illustrated as a function of a refractive index (RI) for light having a wavelength of about 633 nm. In some embodiments, different refractive indices of the same material correspond to different compositions of the same material. In some embodiments where the material comprises SiOC, different refractive indices correspond to different contents of carbon in SiOC. As shown in FIG. 5, by adding Si—CH$_3$ bonds to a SiOC material, the etch rate is not significantly increased. Furthermore, by performing a UV treatment (such as the UV treatment described with reference to FIG. 3) on a SiOC material with added Si—CH$_3$ bonds, the etch rate is decreased.

Figure 6:
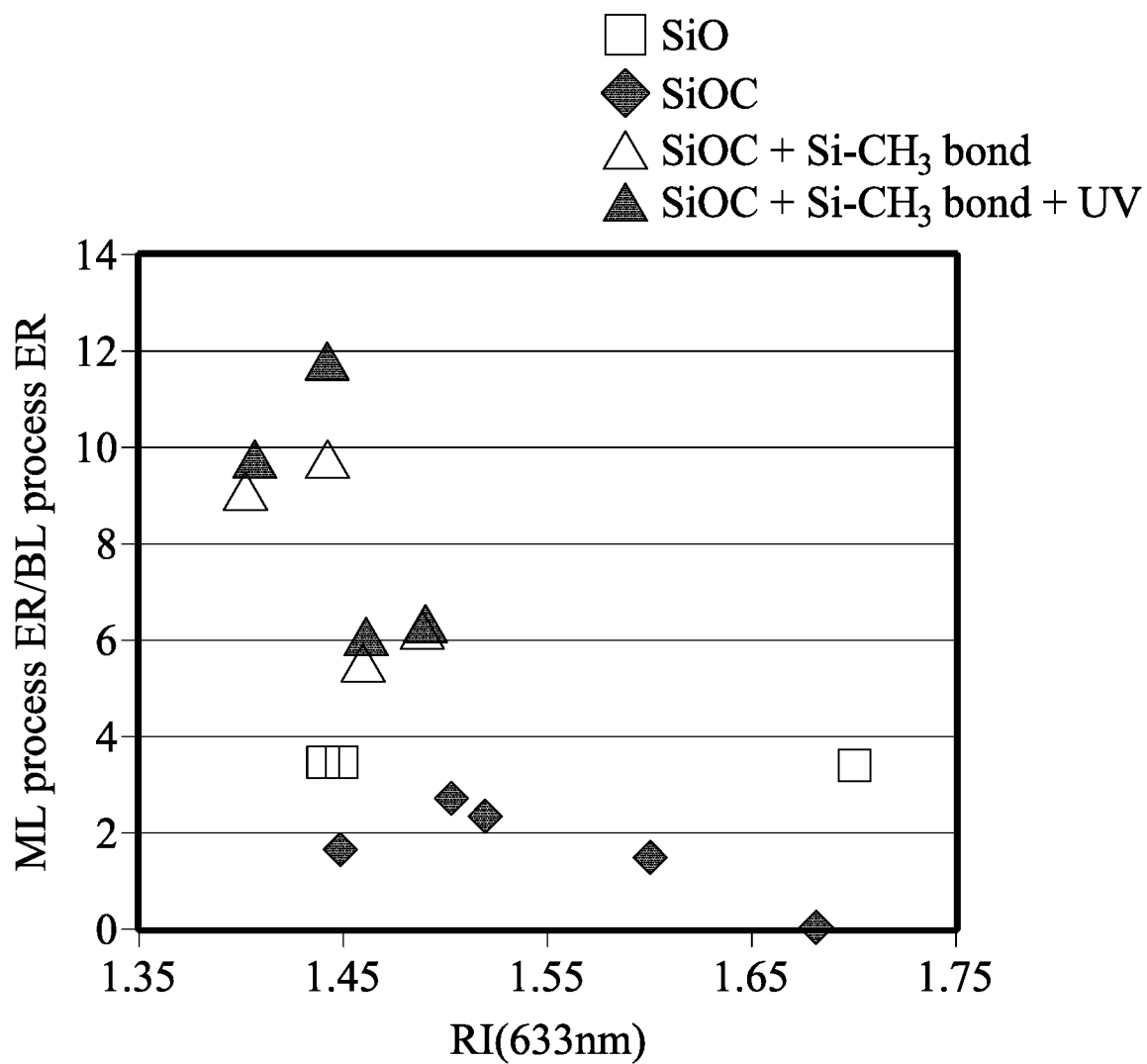
FIG. 6 illustrates ratios of etch rates in an etching process for patterning a middle layer of a multi-layer mask to etch rates in an etching process for patterning a bottom layer of the multi-layer mask for various materials in accordance with some embodiments.

FIG. 6 illustrates ratios of etch rates in an etching process for patterning the first middle layer 201B of the multi-layer mask 201 to etch rates in an etching process for patterning the bottom layer 201A of the multi-layer mask 201 for various candidate materials for the first middle layer 201B in accordance with some embodiments. Unfilled squares correspond to a SiO material, filled diamonds correspond to a SiOC material without added Si—CH$_3$ bonds and without performing a UV treatment, unfilled triangles correspond to a SiOC material with added Si—CH$_3$ bonds and without performing a UV treatment, and filled triangles correspond to a SiOC material with added Si—CH$_3$ bonds and with performing a UV treatment. The etch rate ratios are illustrated as a function of a refractive index (RI) for light having a wavelength of about 633 nm. In some embodiments, different refractive indices of the same material correspond to different compositions of the same material. In some embodiments where the material comprises SiOC, different refractive indices correspond to different contents of carbon in SiOC. As shown in FIG. 6, by adding Si—CH$_3$ bonds to a SiOC material, the etch selectivity is improved. Furthermore, by performing a UV treatment (such as the UV treatment described with reference to FIG. 3) on a SiOC material with added Si—CH$_3$ bonds, the etch selectivity is further improved.

Referring to FIG. 7, a second middle layer 201C of the multi-layer mask 201 is formed over the first middle layer 201B of the multi-layer mask 201, and a top layer 201D of the multi-layer mask 201 is formed over the second middle layer 201C of the multi-layer mask 201. In some embodiments, the second middle layer 201C may comprise a silicon-containing material, such as silicon oxide, silicon oxycarbide (SiOC), or the like, and may be formed using spin-on, CVD, ALD, or the like. In some embodiments, a thickness of the second middle layer 201C is between about 50 Å and about 2000 Å. In some embodiments where the second middle layer 201C comprises a SiOC material, a content of Si—CH$_3$ bonds in the SiOC material is less than about 0.5%. In some embodiments, by reducing the content of Si—CH$_3$ bonds in the SiOC material, an etch rate of the SiOC material under an oxygen plasma is reduced. By reducing the content of Si—CH$_3$ bonds in the SiOC material to be less than about 0.5%, the second middle layer 201C may be used as a protective layer for the first middle layer 201B during a subsequently performed descum process and may act a stop layer during the descum process. In some embodiments, the top layer 201D may comprise a photoresist material, or the like, and may be formed using a spin-on coating, or the like. In some embodiment, a thickness of the top layer 201D is between about 50 Å and about 2000 Å.

Figure 8:
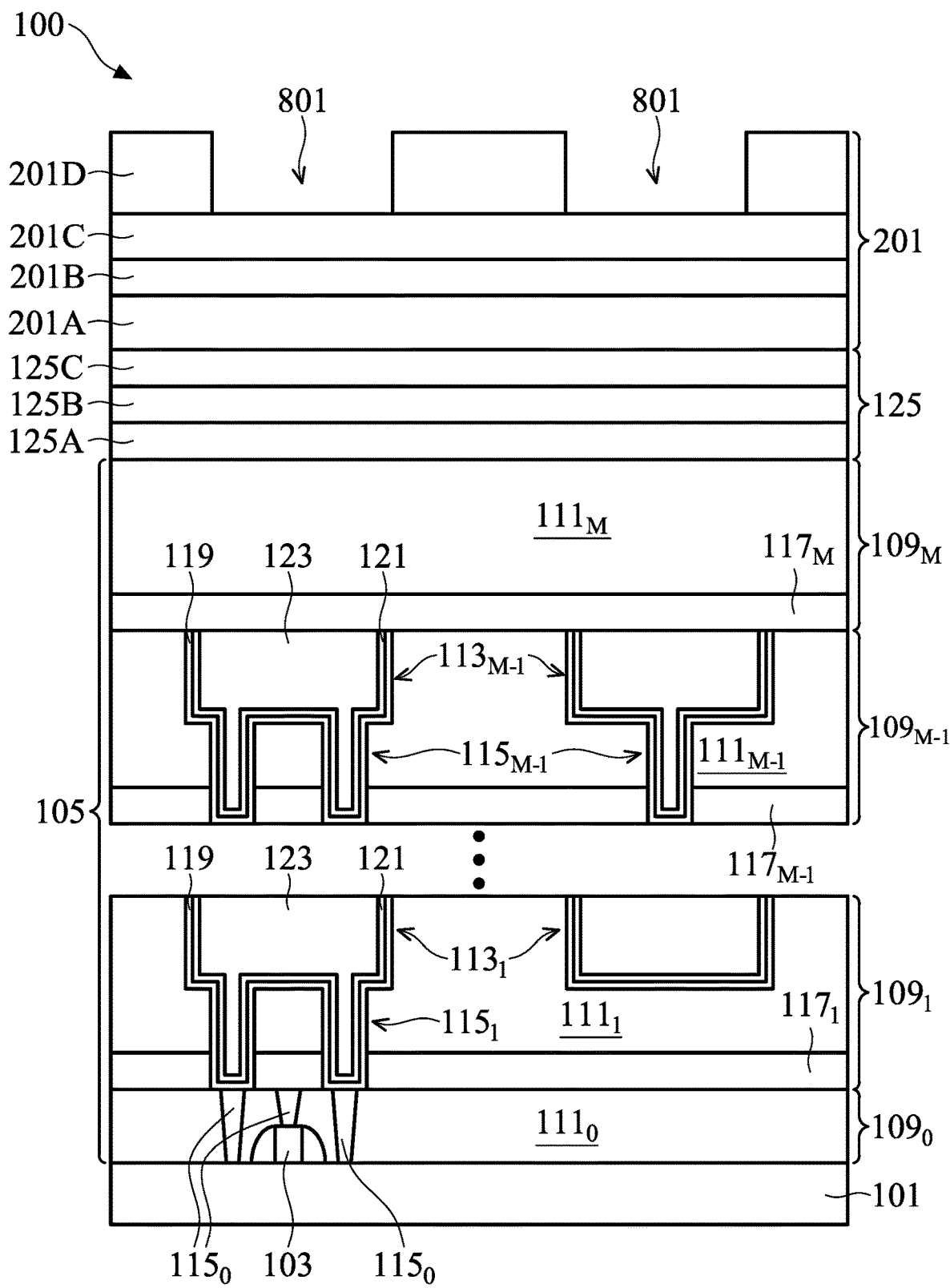

Referring to FIG. 8, the top layer 201D of the multi-layer mask 201 is patterned to form openings 801 in the top layer 201D. The top layer 201D is patterned using suitable photolithography techniques. In some embodiments where the top layer 201D comprises a photoresist material, the photoresist material is irradiated (exposed) and developed to remove portions of the photoresist material. In some embodiments, a width of the openings 801 is between about 25 nm and about 35 nm. In some embodiments, after patterning the top layer 201D, a descum process is performed to remove any residual photoresist material from the openings 801. In some embodiments, the descum process may be a plasma process performed using an oxygen plasma, or the like. In some embodiments, the second middle layer 201C acts as a protective layer for the first middle layer 201B during the descum process. By using the second middle layer 201C, the first middle layer 201B is not damaged by the descum process.

Figure 9:
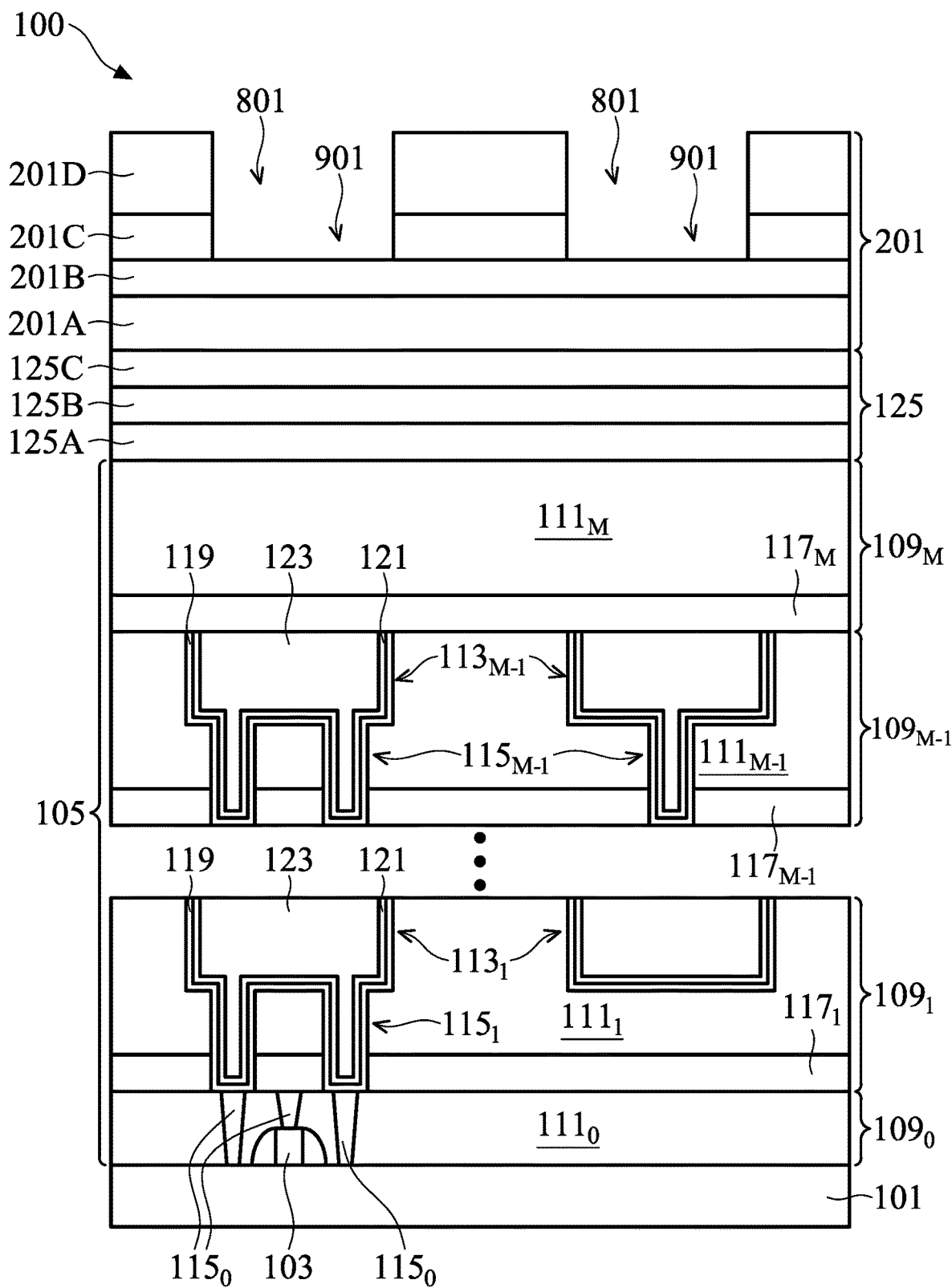

Referring to FIG. 9, a first patterning process is performed on the second middle layer 201C of the multi-layer mask 201 to transfer the pattern of the openings 801 in the top layer 201D to the second middle layer 201C. The first patterning process forms openings 901 in the second middle layer 201C. In some embodiments, the first patterning process may comprise one or more etching processes, where the top layer 201D is used as an etch mask. The one or more etching processes may include suitable anisotropic dry etching processes, such as a reactive ion etching (RIE) process, or the like. In some embodiments, an etchant mixture may comprise F-based chemicals, such as $C_xF_y$, or the like. In some embodiments, the etchant mixture may further include $O_2$, $N_2$, $H_2$, Ar, $C_xO_y$, a combination thereof, or the like. In some embodiments, the openings 901 in the second middle layer 201C may have approximately same widths and pitch as respective openings 801 in the top layer 201D.

Figure 10:
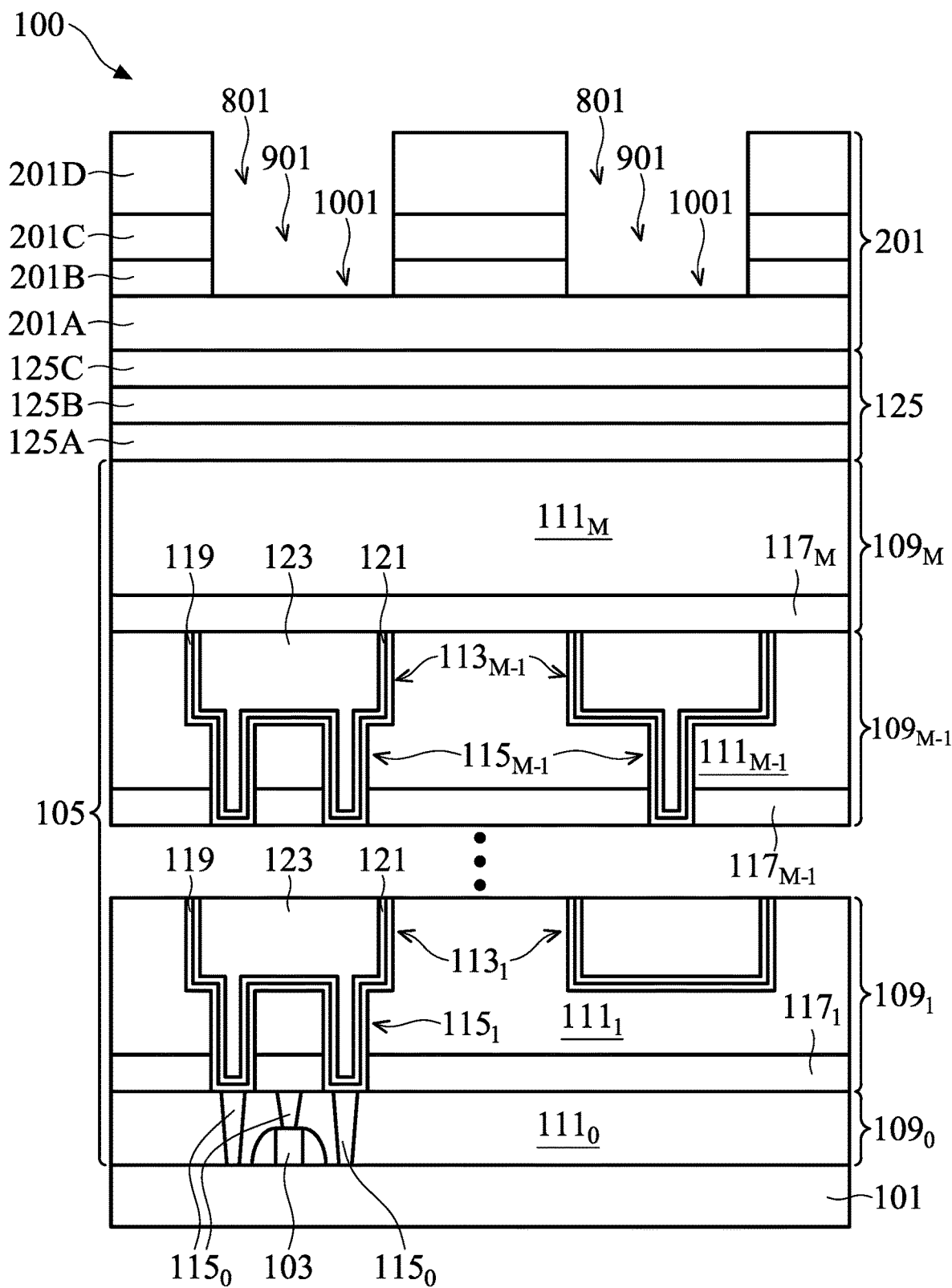

Referring to FIG. 10, a second patterning process is performed on the first middle layer 201B of the multi-layer mask 201 to transfer the pattern of the openings 901 in the second middle layer 201C to the first middle layer 201B. The second patterning process forms openings 1001 in the first middle layer 201B. In some embodiments, the second patterning process may comprise one or more etching processes, where the top layer 201D is used as an etch mask. The one or more etching processes may include suitable anisotropic dry etching processes, such as a reactive ion etching (RIE) process, or the like. In some embodiments, an etchant mixture may comprise F-based chemicals, such as $C_xF_y$, or the like. In some embodiments, the etchant mixture may further include $O_2$, $N_2$, $H_2$, Ar, $C_xO_y$, a combination thereof, or the like. In an embodiment, the second patterning process is performed using a mixture of $CF_4$ and $N_2$. In some embodiments, the openings 1001 in the first middle layer 201B may have approximately same widths and pitch as respective openings 901 in the second middle layer 201C. In some embodiments, by forming the first middle layer 201B using a SiOC material with a high content of Si—CH$_3$ bonds as described above with reference to FIG. 3, tapering of sidewalls of the openings 1001 may be reduced. In some embodiments, sidewalls of the openings 1001 form an angle with a top surface of the bottom layer 201A in a range from about 78 degrees to about 87 degrees.

Referring further to FIGS. 9 and 10, in some embodiments, the first patterning process of the second middle layer 201C and the second patterning process of the first middle layer 201B have same process parameters. In such embodiments, the first patterning process of the second middle layer 201C and the second patterning process of the first middle layer 201B may be performed as a single patterning step. In other embodiments, the first patterning process of the second middle layer 201C and the second patterning process of the first middle layer 201B are performed with different process parameters, such as with different RF powers, or different etchant gas mixtures, for example. In such embodiments, the first middle layer 201B is used as an etch stop layer during the first patterning process performed on the second middle layer 201C and the second middle layer 201C is used as an etch mask during the second patterning process performed on the first middle layer 201B.

Figure 11:
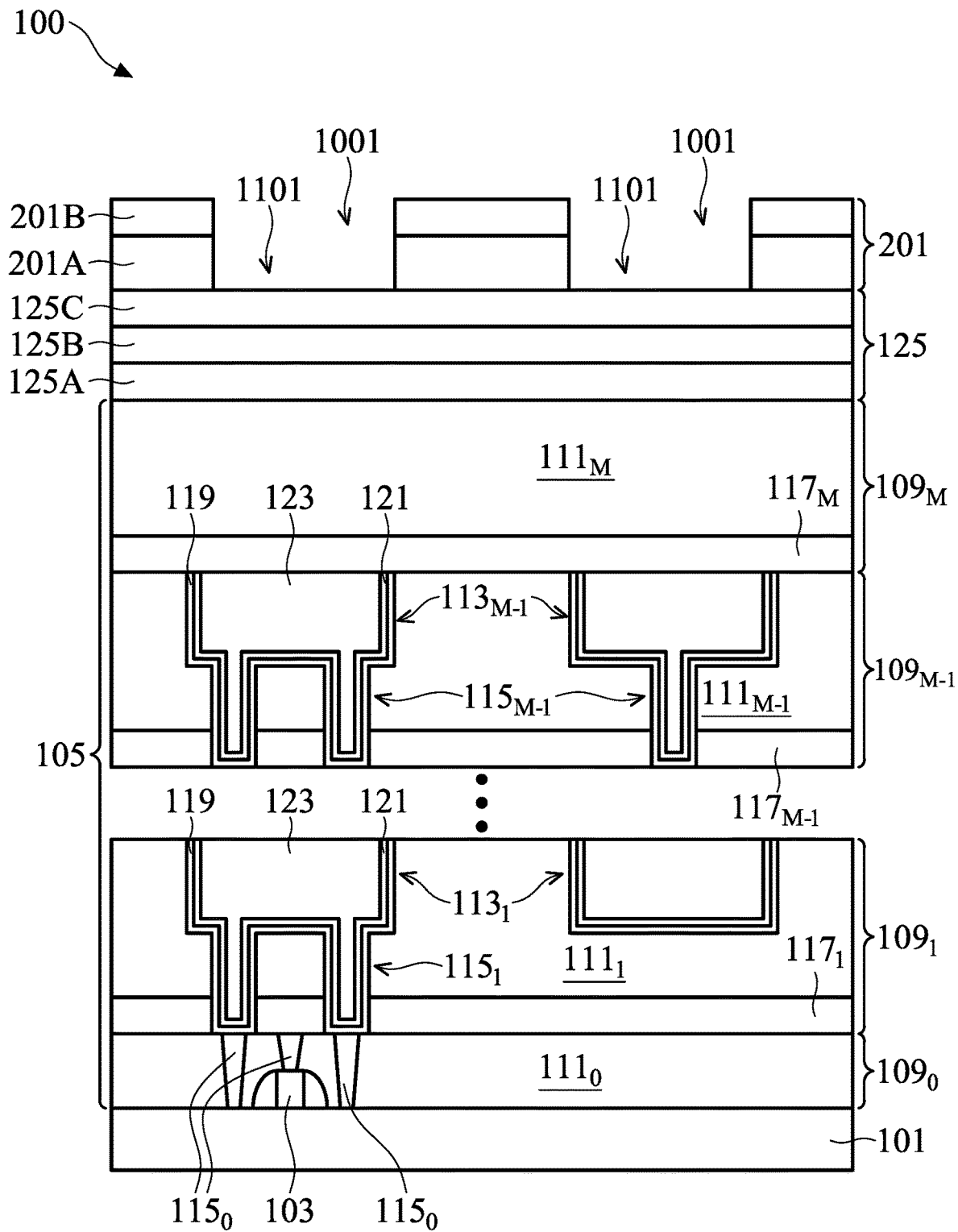

Referring to FIG. 11, a third patterning process is performed on the bottom layer 201A of the multi-layer mask 201 to transfer the pattern of the openings 1001 in the first middle layer 201B to the bottom layer 201A. The third patterning process forms openings 1101 in the bottom layer 201A. In some embodiments, the third patterning process may comprise one or more etching processes, where the first middle layer 201B is used as an etch mask. The one or more etching processes may include suitable anisotropic dry etching processes, such as a reactive ion etching (RIE) process, or the like. In some embodiments, an etchant mixture may include $O_2$, $N_2$, $H_2$, Ar, $C_xO_y$, a combination thereof, or the like. In an embodiment, the third patterning process is performed using a mixture of $H_2$ and $N_2$. In some embodiments, the openings 1101 in the bottom layer 201A may have approximately same widths and pitch as respective openings 1001 in the first middle layer 201B. In some embodiments, the patterning process may consume the top layer 201D and the second middle layer 201C of the multi-layer mask 201 (see FIG. 10). In other embodiments, the top layer 201D and the second middle layer 201C may be removed after forming the openings 1101 in the bottom layer 201A.

Figure 12:
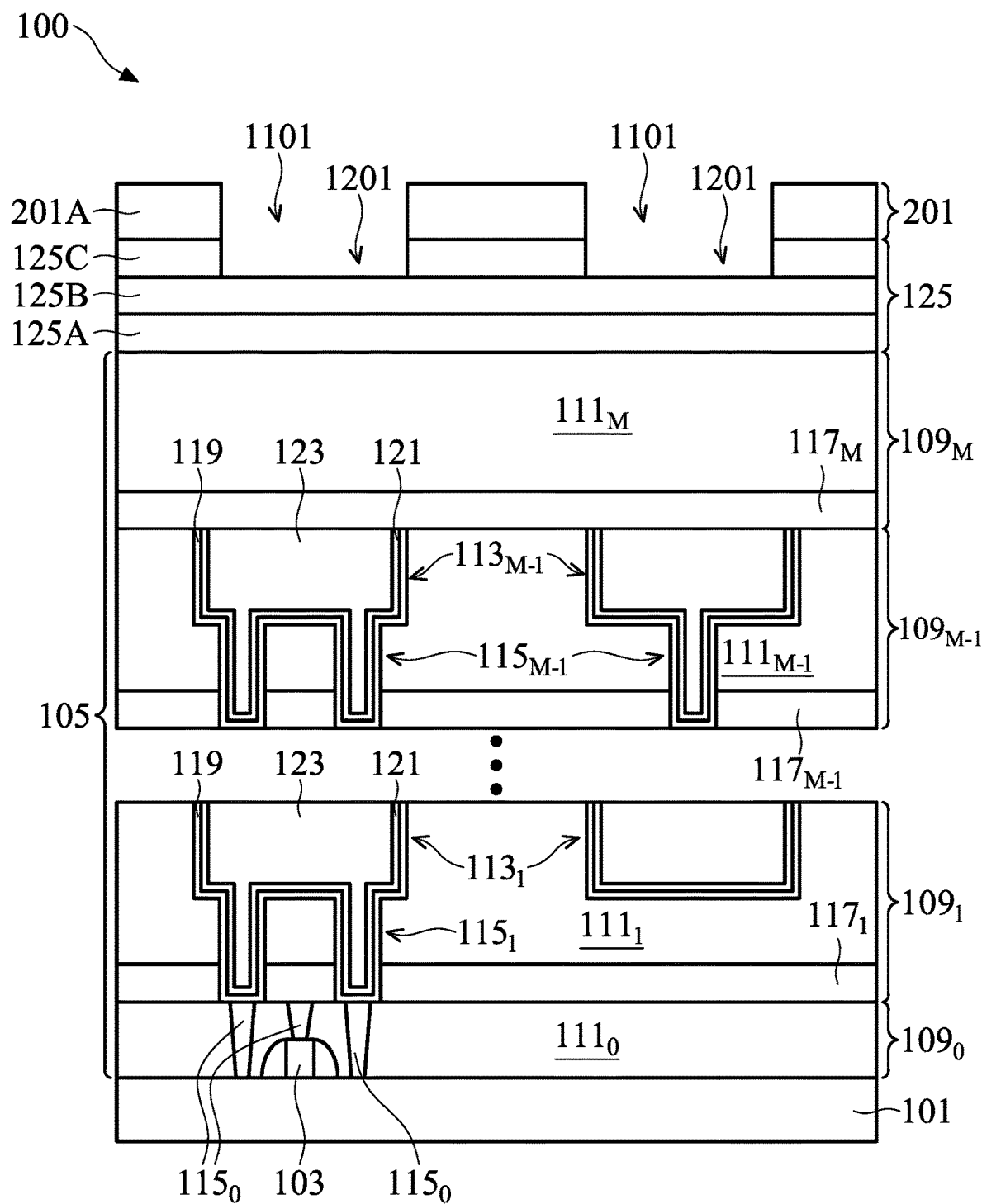

Referring to FIG. 12, a fourth patterning process is performed on the third hard mask layer 125C to transfer the pattern of the openings 1101 in the bottom layer 201A to the third hard mask layer 125C. The fourth patterning process forms openings 1201 in the third hard mask layer 125C. In some embodiments, the fourth patterning process may comprise one or more etching processes, where the bottom layer 201A is used as an etch mask. The one or more etching processes may include suitable anisotropic dry etching processes, such as a reactive ion etching (RIE) process, or the like. In some embodiments, an etchant mixture may comprise F-based chemicals, such as $C_xF_y$, or the like. In some embodiments, the etchant mixture may further include $O_2$, $N_2$, $H_2$, Ar, $C_xO_y$, a combination thereof, or the like. In an embodiment, the fourth patterning process is performed using a mixture of $CF_4$ and $N_2$. In some embodiments, the openings 1201 in the third hard mask layer 125C may have approximately same widths and pitch as respective openings 1101 in the bottom layer 201A. In some embodiments, the patterning process may consume the first middle layer 201B (see FIG. 11). In other embodiments, the first middle layer 201B may be removed after forming the openings 1201 in the third hard mask layer 125C.

Figure 13:
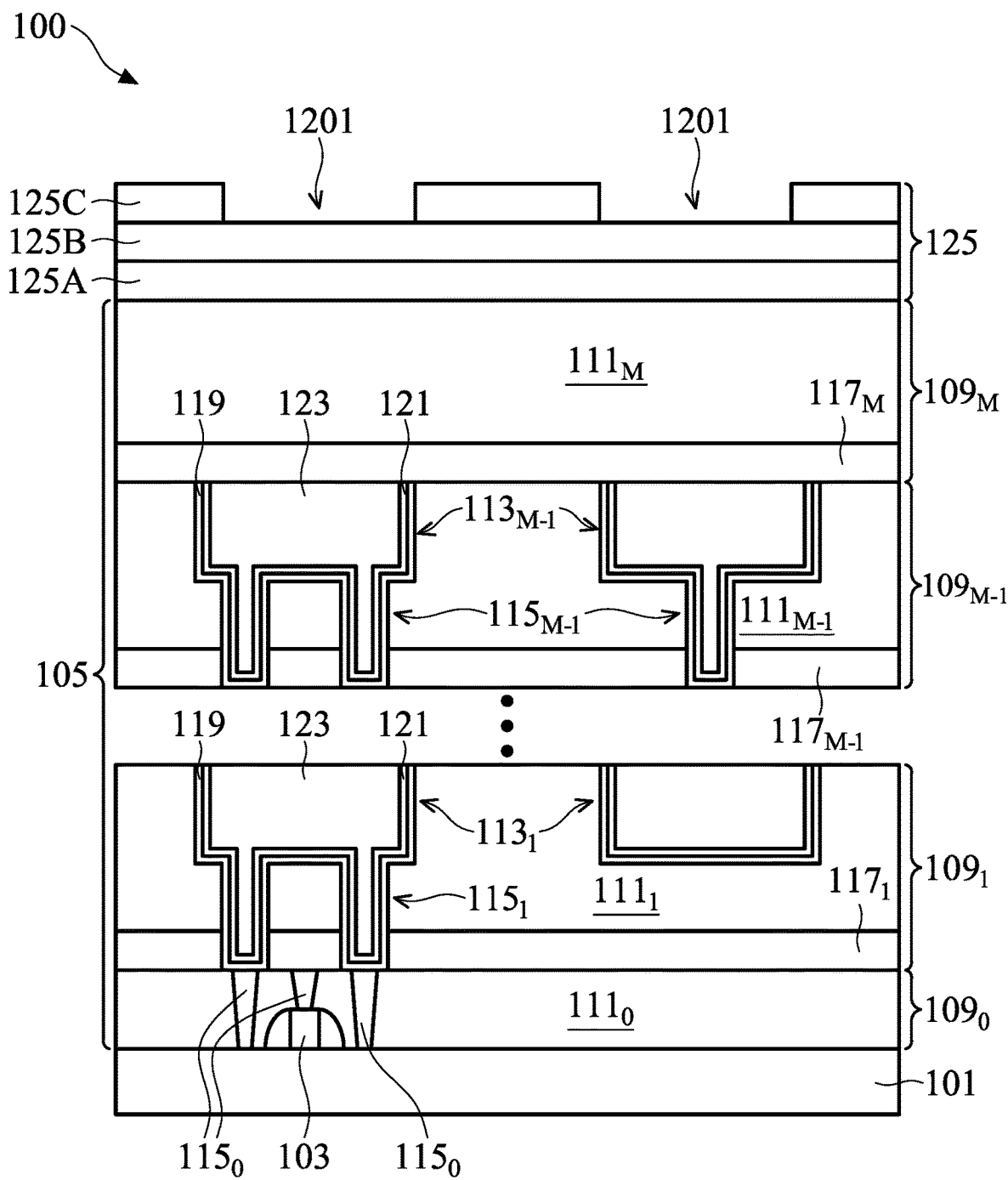

Referring to FIG. 13, after forming the openings 1201 in the third hard mask layer 125C, the bottom layer 201A of the multi-layer mask 201 (see FIG. 12) is removed. In some embodiments, the removal process may comprise an ashing process followed by a wet clean process.

Figure 14:
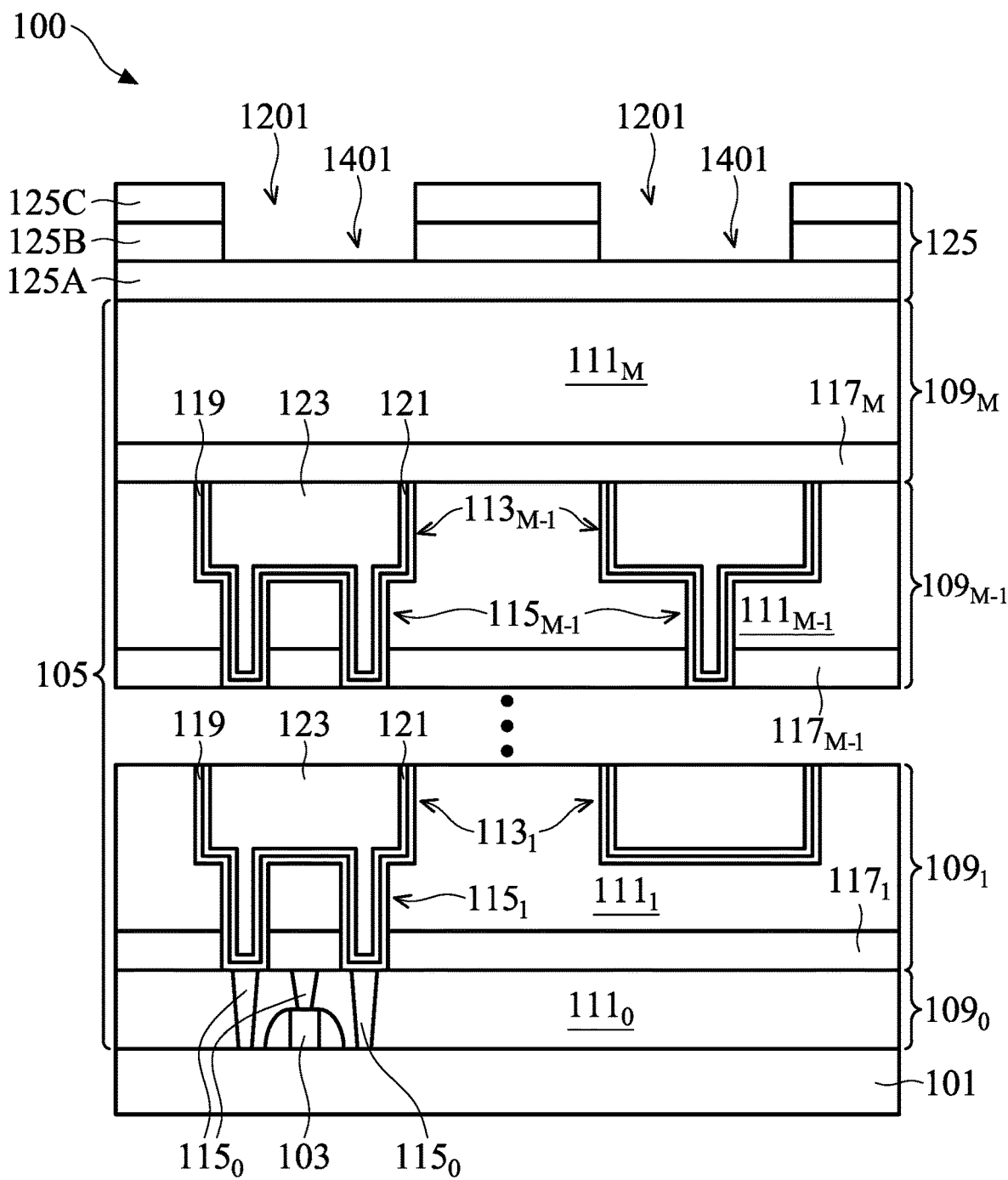

Referring to FIG. 14, a patterning process is performed on the second hard mask layer 125B to transfer the pattern of the openings 1201 in the third hard mask layer 125C to the second hard mask layer 125B. The patterning process forms openings 1401 in the second hard mask layer 125B. In some embodiments, the patterning process may comprise one or more etching processes, where the third hard mask layer 125C is used as an etch mask. The one or more etching processes may include suitable anisotropic dry etching processes, such as a reactive ion etching (RIE) process, or the like. In some embodiments, an etchant mixture may comprise Cl-based chemicals, such as $Cl_2$, $BCl_3$, a combination thereof, or the like. In some embodiments, the etchant mixture may further include $O_2$, $N_2$, $H_2$, Ar, $C_xO_y$, a combination thereof, or the like. In some embodiments, the openings 1401 in the second hard mask layer 125B may have approximately same widths and pitch as respective openings 1201 in the third hard mask layer 125C.

Figure 15:
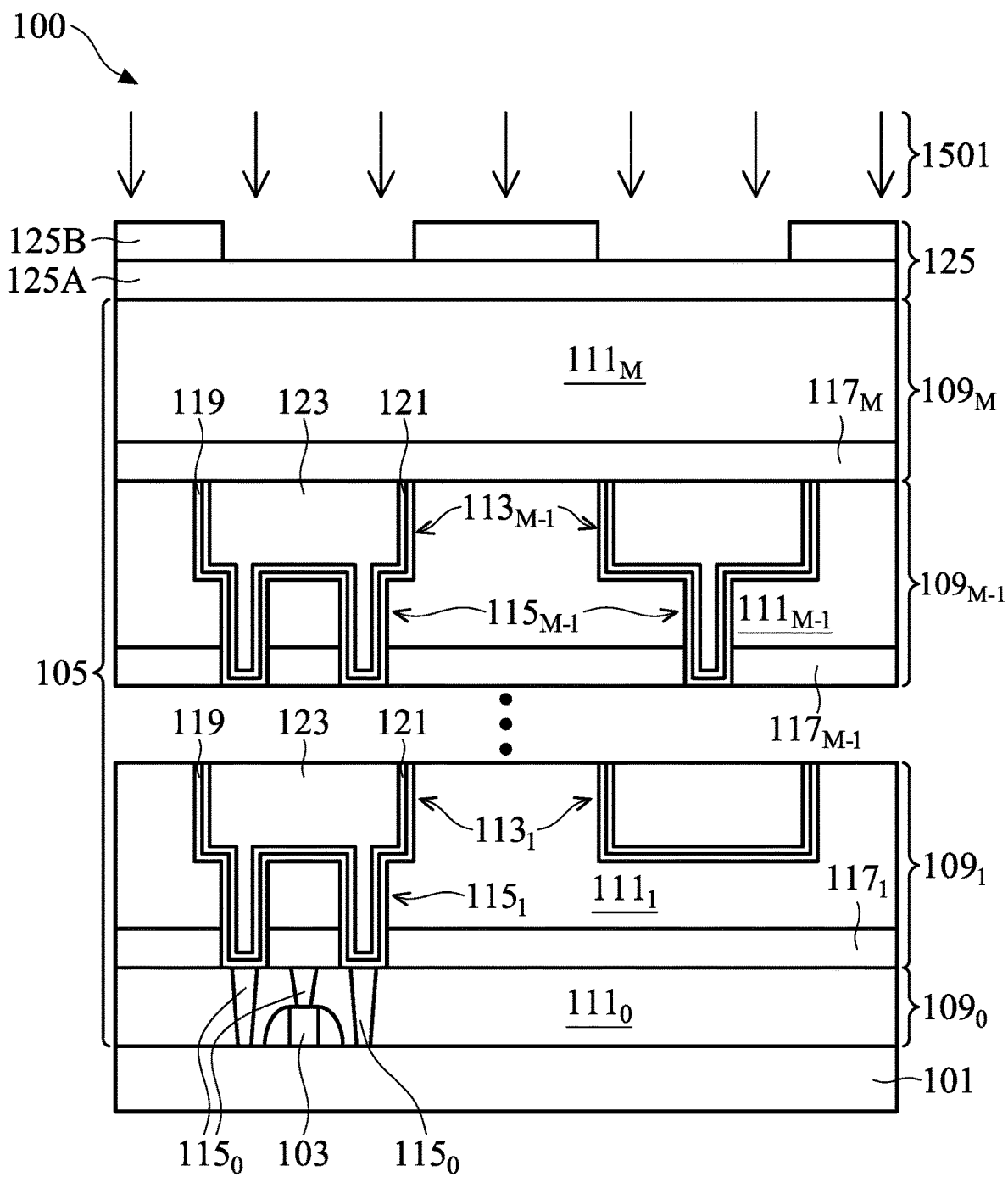

Referring to FIG. 15, after forming the openings 1401 in the second hard mask layer 125B, the third hard mask layer 125C (see FIG. 14) is removed. In some embodiments, the removal process may comprise a suitable etching process, or the like. In some embodiments, after removing the third hard mask layer 125C, a UV treatment (depicted using arrows 1501 in FIG. 15) may be performed on the first hard mask layer 125A and the second hard mask layer 125B. In some embodiments, the UV treatment 1501 may be similar to the UV treatment 301 described above with reference to FIG. 3 and the description is not repeated herein. In some embodiments, the UV treatment 1501 may be performed at a temperature between about 10° C. and about 450° C. In other embodiments, the UV treatment 1501 may be omitted. In some embodiments, the UV treatment 1501 hardens and densifies the second hard mask layer 125B, such that the etch rate of the second hard mask layer 125B is lowered and a ratio of the etch rate of the second hard mask layer 125B to the etch rate of the first hard mask layer 125A is lowered.

Figure 16:
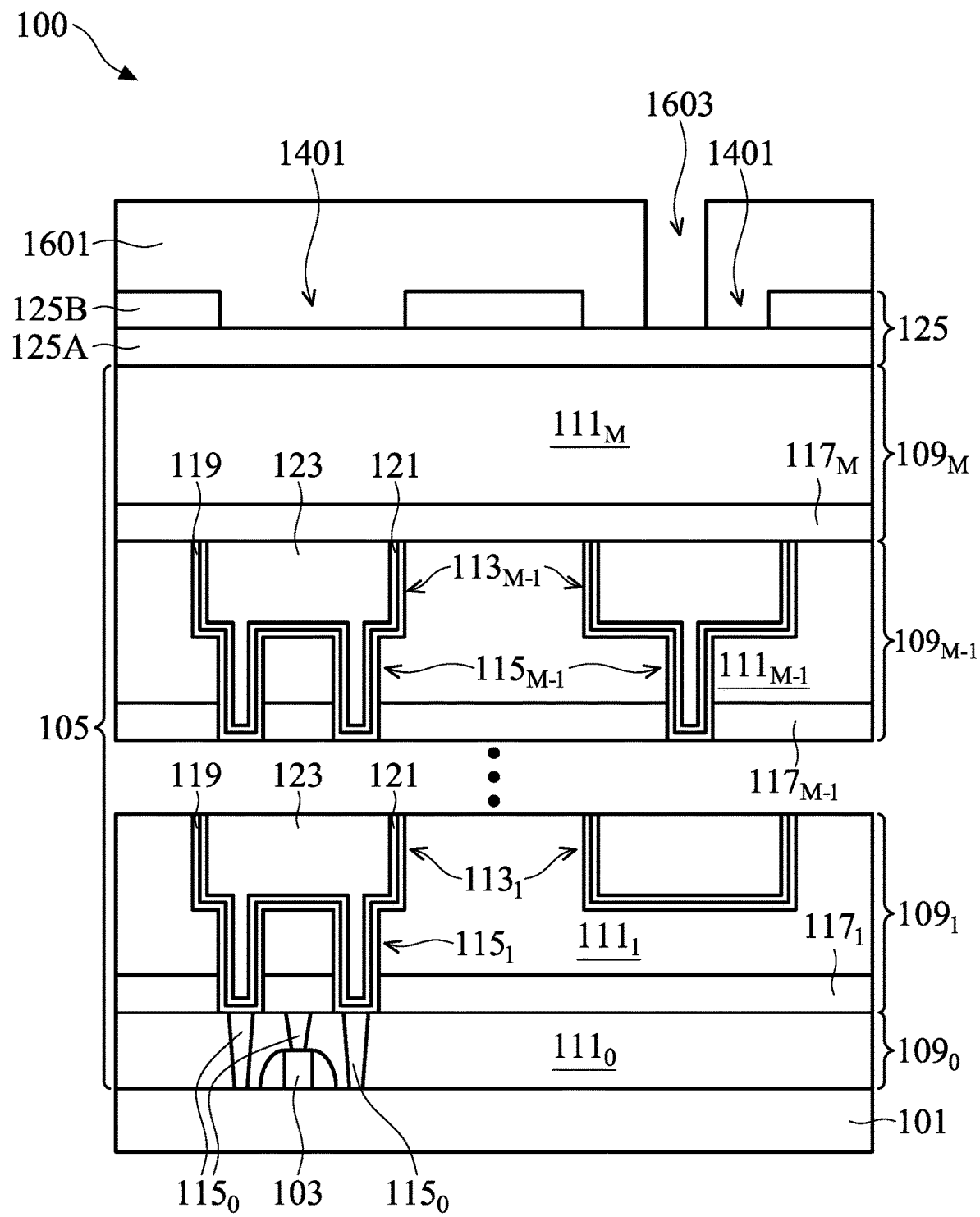

Referring to FIG. 16, a mask layer 1601 is formed over the second hard mask layer 125B and is patterned to form an opening 1603 therein. In some embodiments, the mask layer 1601 may comprise a photoresist and may be patterned using suitable photolithography methods. In some embodiments, the opening 1603 extends through a portion of the mask layer 1601 formed in the opening 1401 and exposes the first hard mask layer 125A. In some embodiments, a width of the opening 1603 is less than a width of the respective opening 1401. In some embodiments, a width of the opening 1603 is between about 15 nm and about 25 nm. As described below in greater detail, the opening 1603 is extended into the dielectric layer $111_M$ to form a via opening (see FIG. 18). In some embodiments, the rightmost opening 1401 where the opening 1603 is disposed may be formed to have a greater width than the leftmost opening 1401 where no opening is disposed. In such embodiments, the width of the rightmost opening 1401 is adjusted such that misalignment between the rightmost opening 1401 and the opening 1603 is reduced or avoided. In some embodiments, the width of the leftmost opening 1401 equals to a minimum dimension achievable by the patterning process and the width of the rightmost opening 1401 is greater than the minimum dimension.

Figure 17:
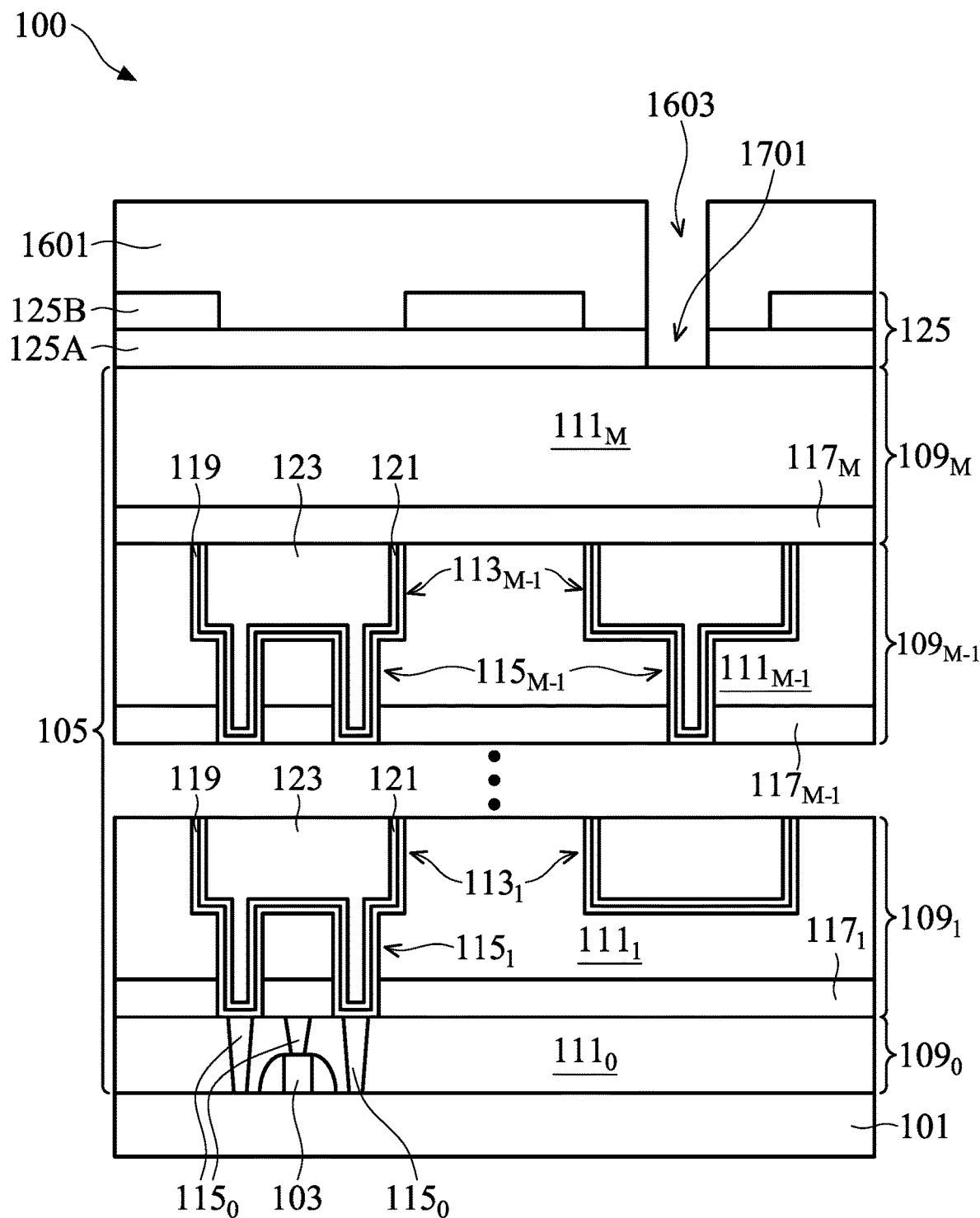

Referring to FIG. 17, a patterning process is performed on the first hard mask layer 125A to transfer the pattern of the opening 1603 in the mask layer 1601 to the first hard mask layer 125A. The patterning process forms an opening 1701 in the first hard mask layer 125A. In some embodiments, the patterning process may comprise one or more etching processes, where the mask layer 1601 is used as an etch mask. The one or more etching processes may include suitable anisotropic dry etching processes, such as a reactive ion etching (RIE) process, or the like. In some embodiments, an etchant mixture may comprise F-based chemicals, such as $C_xF_y$, or the like. In some embodiments, the etchant mixture may further include $O_2$, $N_2$, $H_2$, Ar, $C_xO_y$, a combination thereof, or the like. In some embodiments, the opening 1701 in the first hard mask layer 125A may have approximately same width as the opening 1603 in the mask layer 1601.

Figure 18:
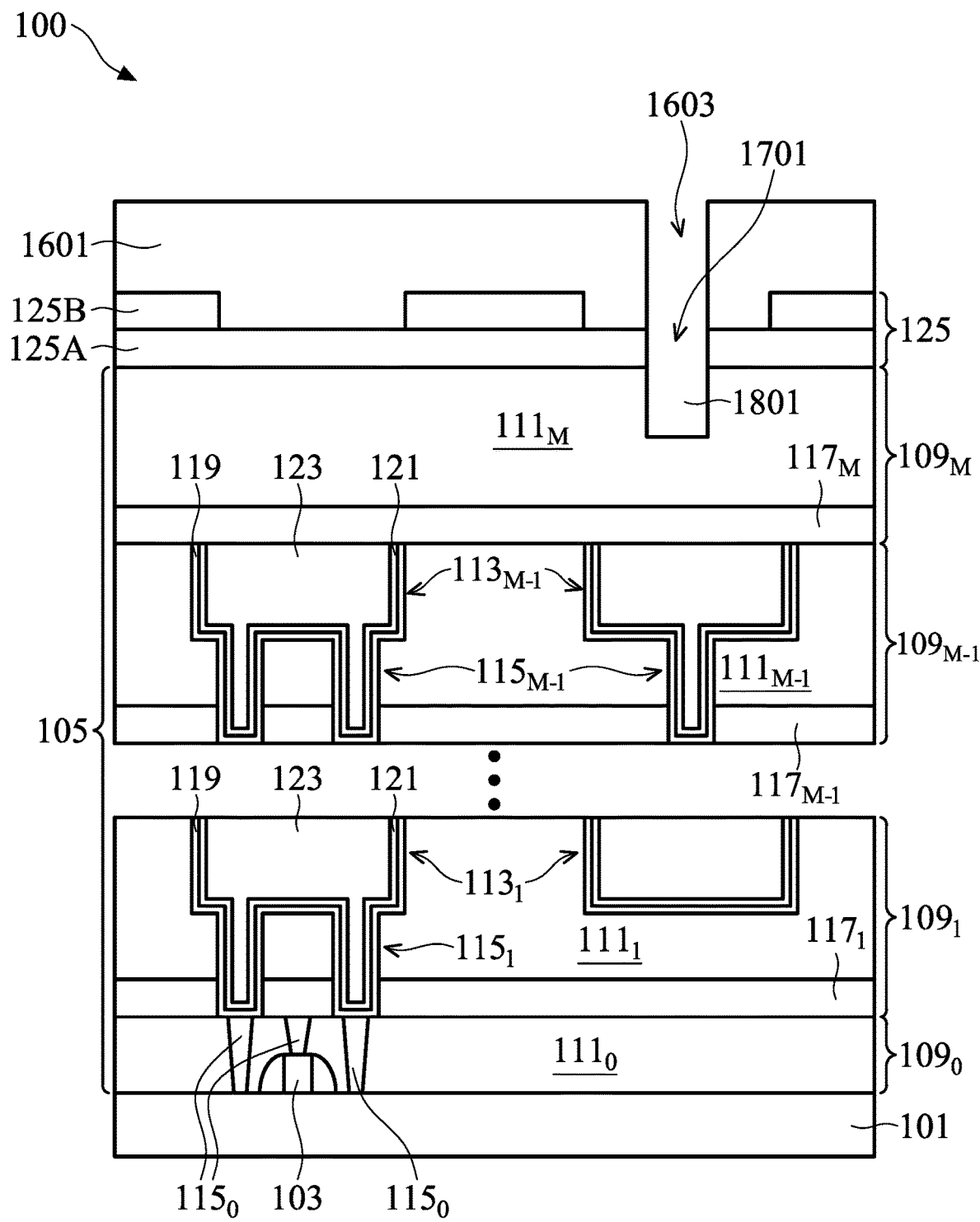

Referring to FIG. 18, a patterning process is performed on the dielectric layer $111_M$ to transfer the pattern of the opening 1701 in the first hard mask layer 125A to the dielectric layer $111_M$. The patterning process forms an opening 1801 in the dielectric layer $111_M$. In some embodiments, the patterning process may comprise one or more etching processes, where the mask layer 1601 and the first hard mask layer 125A are used as an etch mask. The one or more etching processes may include suitable anisotropic dry etching processes, such as a reactive ion etching (RIE) process, or the like. In some embodiments, an etchant mixture may comprise F-based chemicals, such as $C_xF_y$, or the like. In some embodiments, the etchant mixture may further include $O_2$, $N_2$, $H_2$, Ar, $C_xO_y$, a combination thereof, or the like. In some embodiments, the opening 1801 in the dielectric layer $111_M$ may have approximately same width as the opening 1701 in the first hard mask layer 125A. In some embodiments, the opening 1801 extends partially into the dielectric layer $111_M$.

Figure 19:
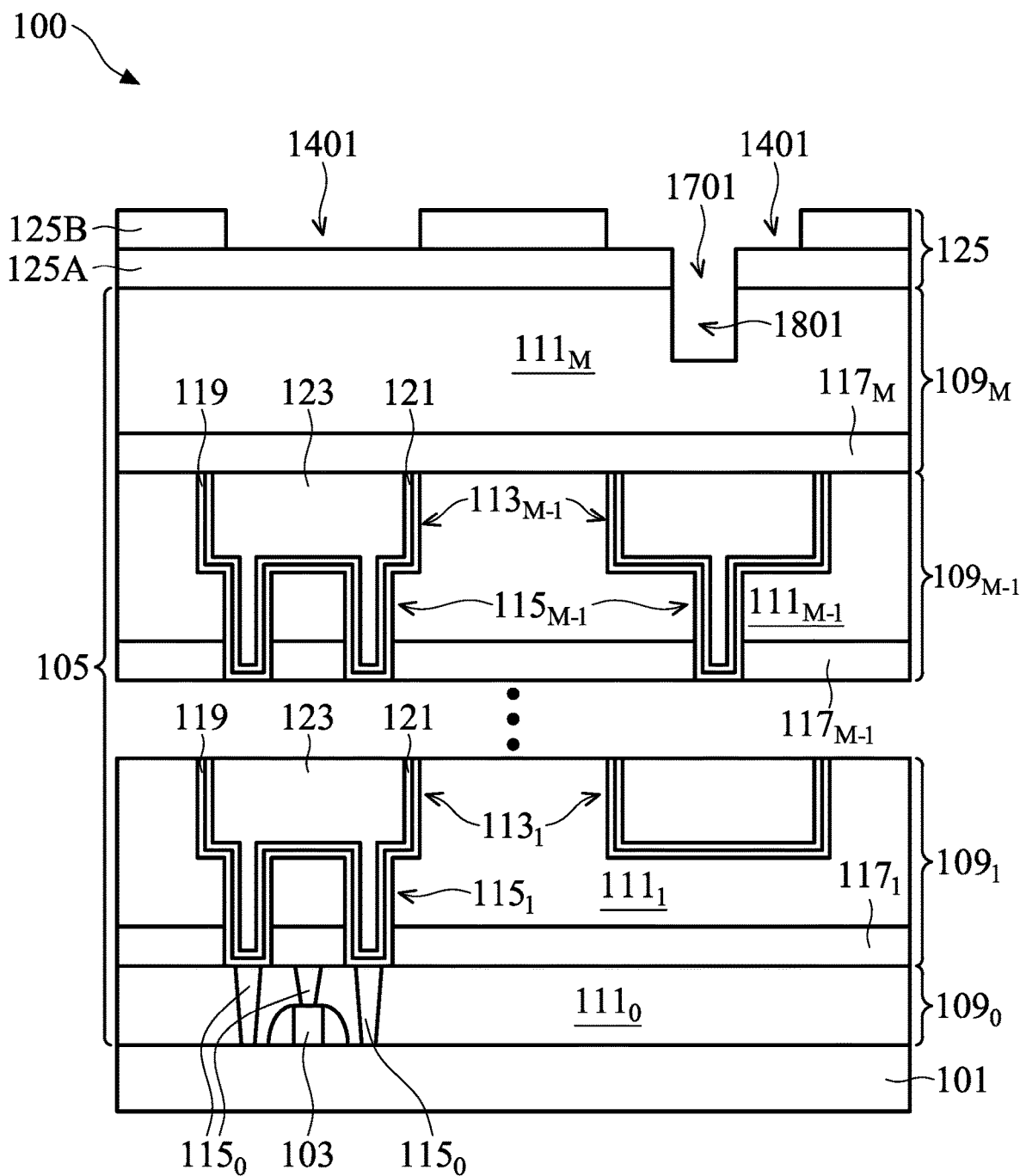

Referring to FIG. 19, after forming the opening 1801 in the dielectric layer $111_M$, the mask layer 1601 (see FIG. 18) is removed. In some embodiments when the mask layer 1601 comprises a photoresist, the removal process may comprise an ashing process followed by a wet clean process.

Figure 20:
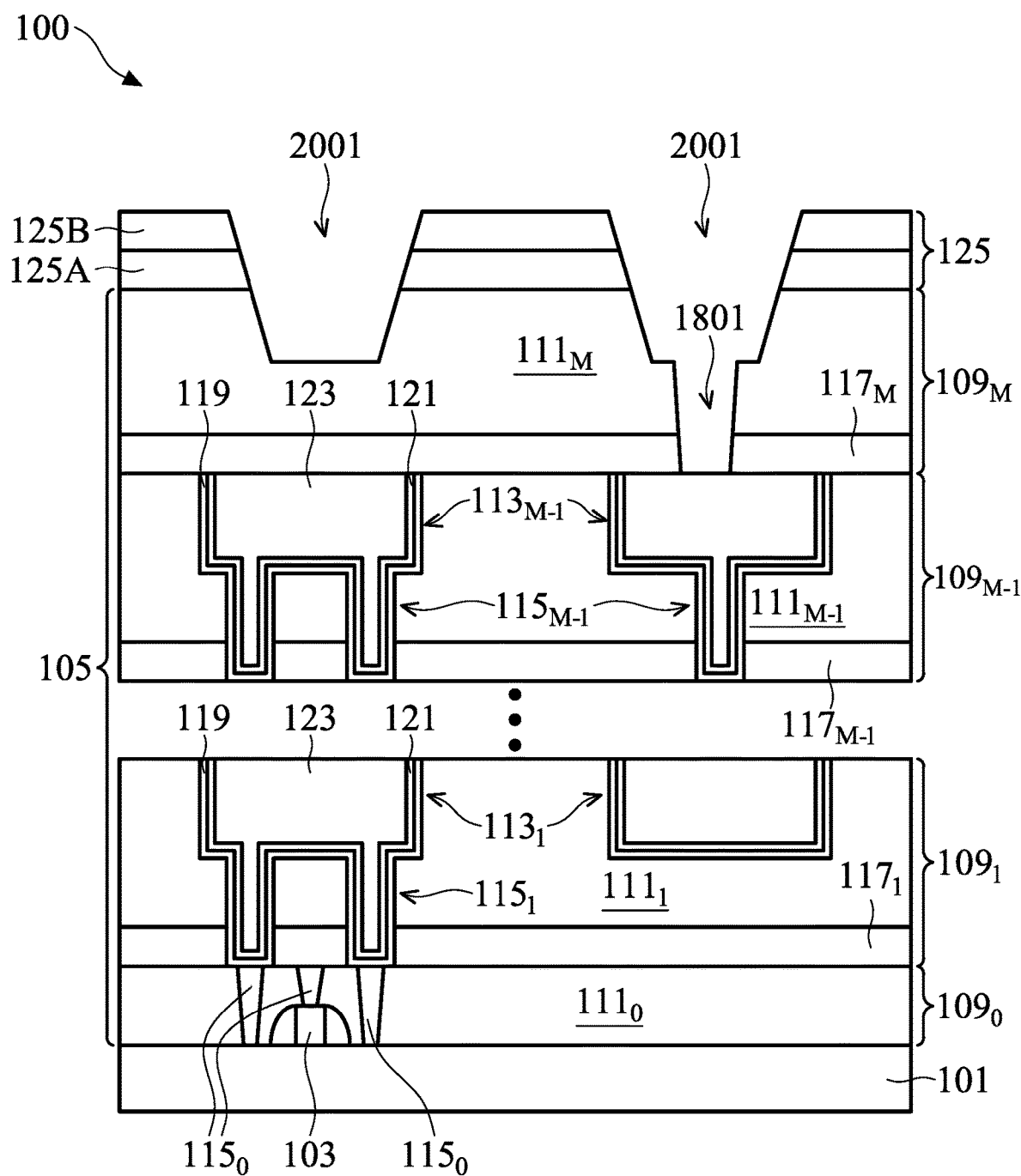

Referring to FIG. 20, a patterning process is performed on the dielectric layer $111_M$ to transfer the pattern of the openings 1401 (see FIG. 19) in the second hard mask layer 125B to the dielectric layer $111_M$. The patterning process forms openings 2001 in the dielectric layer $111_M$. The openings 2001 extend partially into the dielectric layer $111_M$. The patterning process further extends the opening 1801 through the dielectric layer $111_M$ and the ESL $117_M$. The opening 1801 exposes the conductive line $113_{M-1}$. In some embodiments, a width of the openings 2001 is greater than a width of the opening 1801.

Figure 21:
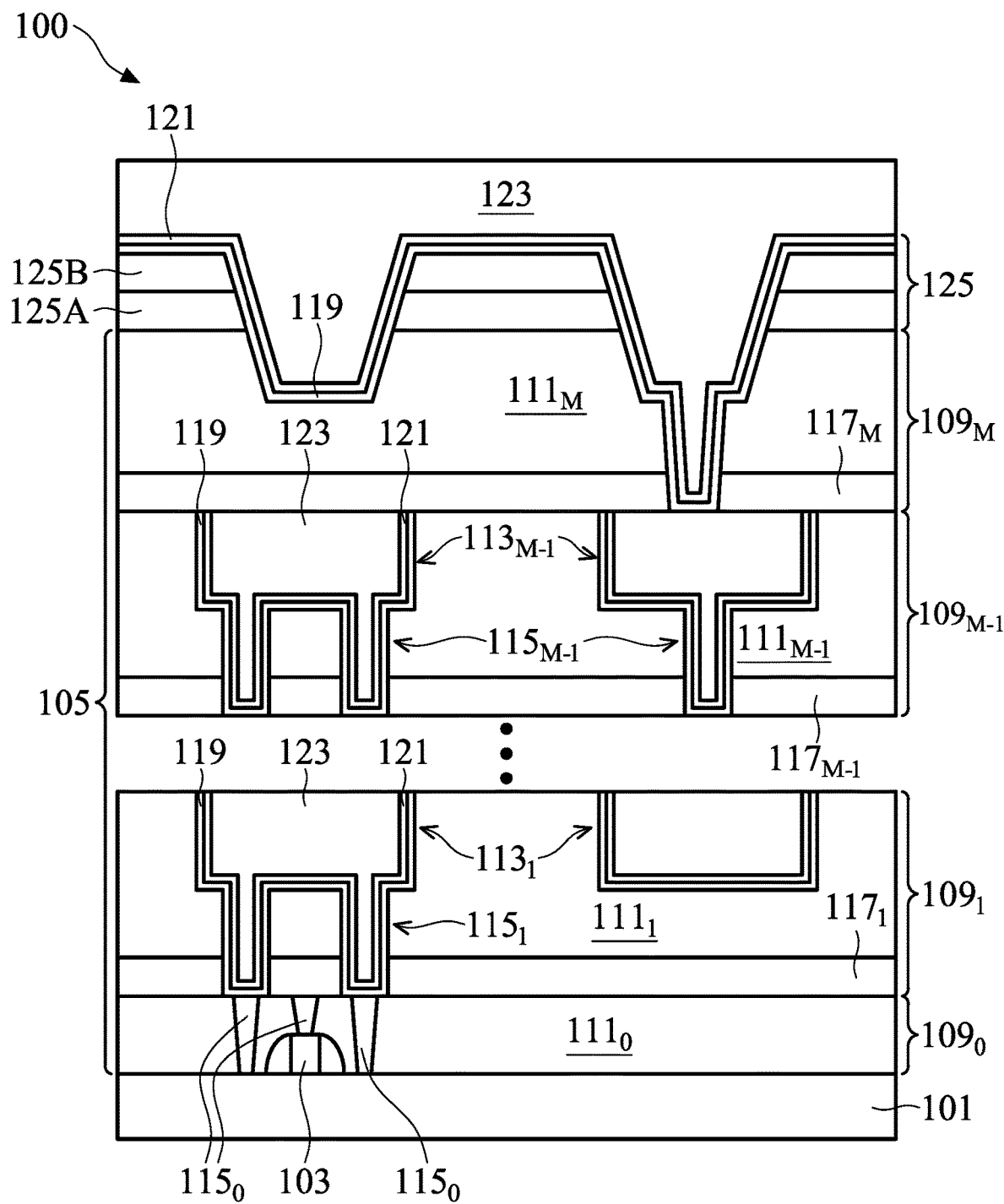
Figure 22:
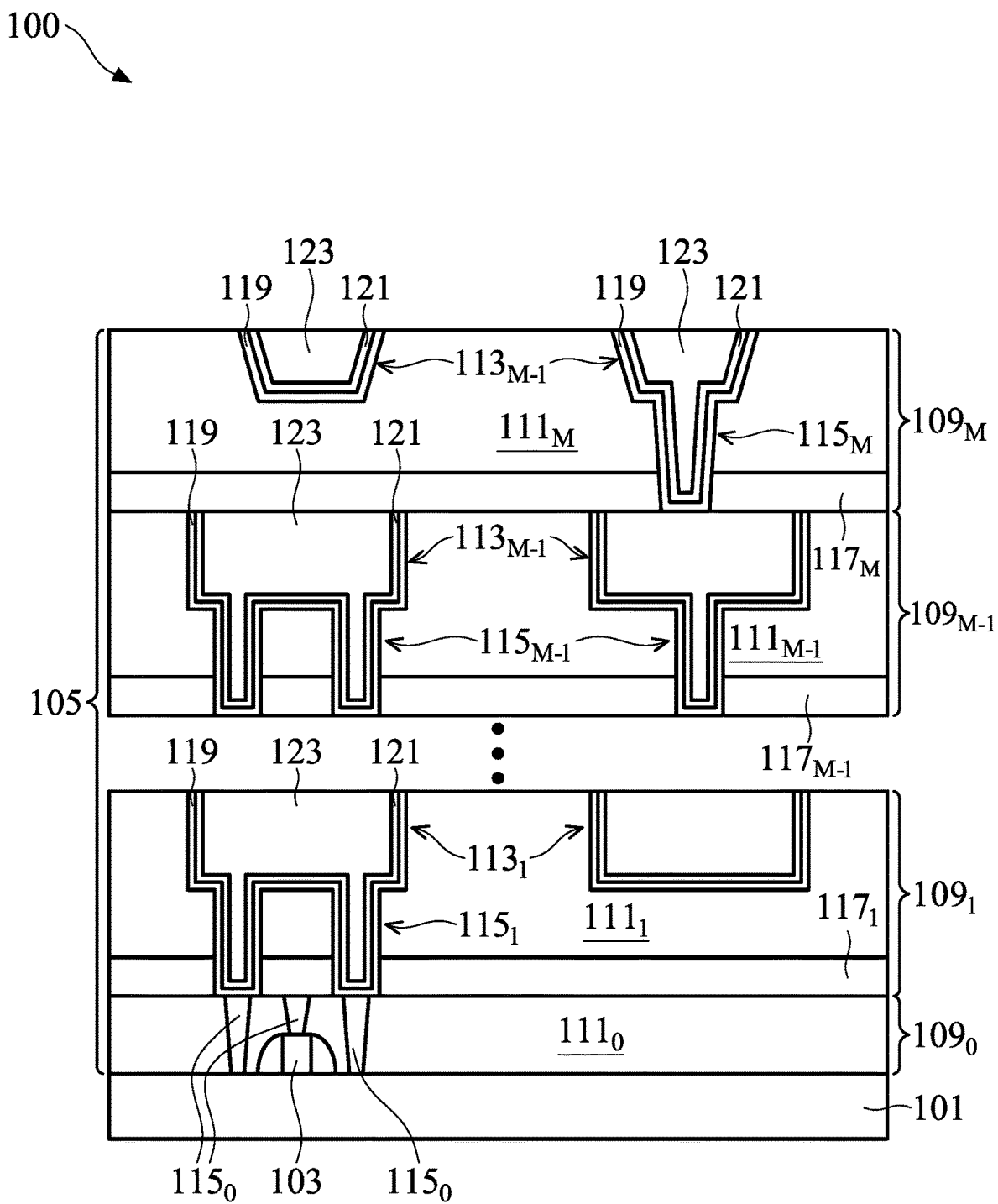

Referring to FIGS. 21 and 22, the conductive lines $113_M$ are formed in the openings 2001 (see FIG. 20) and a conductive via $115_M$ is formed in the opening 1801 (see FIG. 20). In some embodiments, the conductive lines $113_M$ and the conductive via $115_M$ are formed using similar materials and method as the conductive lines $113_1$ to $113_{M-1}$ and the conductive vias $115_1$ to $115_{M-1}$ described above with reference to FIG. 1, and the detailed description is not repeated herein.

Referring first to FIG. 21, one or more barrier/adhesion layers 119 are formed in the openings 1801 and 2001 (see FIG. 20) and over the second hard mask layer 125B, a seed layer 121 is deposited over the one or more barrier/adhesion layers 119, and unfilled portions of openings 1801 and 2001 are filled with a conductive material 123. In some embodiment, the conductive material 123 overfills the openings 1801 and 2001, such that a portion of the conductive material 123 extends along a top surface of the second hard mask layer 125B. In some embodiments, the one or more barrier/adhesion layers 119, the seed layer 121 and the conductive material 123 are formed as described above with reference to FIG. 1, and the description is not repeated herein.

Referring to FIG. 22, a CMP process is performed to remove excess materials of the one or more barrier/adhesion layers 119, the seed layer 121, and the conductive material 123 overfilling the openings 1801 and 2001 (see FIG. 20). In some embodiments, the CMP process also removes the first hard mask layer 125A and the second hard mask layer 125B, such that the dielectric layer $111_M$ is exposed. Remaining portions of the one or more barrier/adhesion layers 119, the seed layer 121, and the conductive material 123 within the openings 2001 form the conductive lines $113_M$. Remaining portions of the one or more barrier/adhesion layers 119, the seed layer 121, and the conductive material 123 within the opening 1801 forms the conductive via $115_M$. In some embodiments, a topmost surface of the dielectric layer $111_M$ is level with topmost surfaces of the conductive lines $113_M$. In some embodiments, the metallization layer $109_M$ may be an intermediate metallization layer of the interconnect structure 105. In such embodiments, additional metallization layers are formed over the metallization layer $109_M$ to complete formation of the interconnect structure 105. In some embodiments, the metallization layer $109_M$ is the final metallization layer of the interconnect structure 105.

Figure 23:
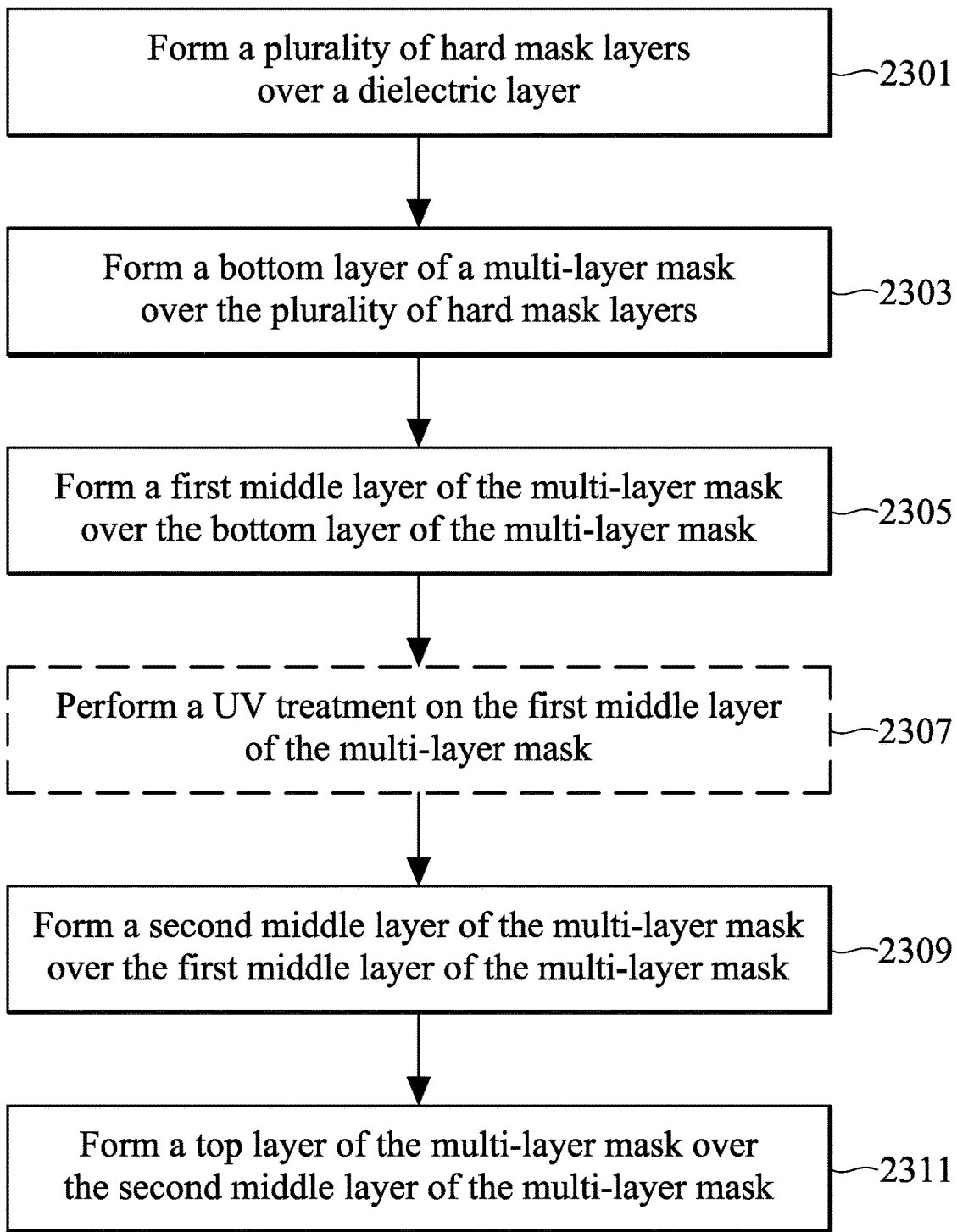
FIG. 23 is a flow diagram illustrating a method of forming a semiconductor structure in accordance with some embodiments.

FIG. 23 is a flow diagram illustrating a method 2300 of forming a multi-layer mask in accordance with some embodiments. The method 2300 starts with step 2301, where a plurality of hard mask layers (such as the first hard mask layer 125A, the second hard mask layer 125B, and third hard mask layer 125C illustrated in FIG. 1) are formed over a dielectric layer (such as the dielectric layer $111_M$ illustrated in FIG. 1) as described above with reference to FIG. 1. In step 2303, a bottom layer (such as the bottom layer 201A illustrated in FIG. 2) of a multi-layer mask (such as the multi-layer mask 201 illustrated in FIG. 7) is formed over the plurality of hard mask layers as described above with reference to FIG. 2. In step 2305, a first middle layer (such as the first middle layer 201B illustrated in FIG. 3) of the multi-layer mask is formed over the bottom layer of the multi-layer mask as described above with reference to FIG. 3. In step 2307, a UV treatment (such as the UV treatment 301 illustrated in FIG. 3) is performed on the first middle layer of the multi-layer mask as described above with reference to FIG. 3. In some embodiments, step 2307 may be omitted. In step 2309, a second middle layer (such as the second middle layer 201C illustrated in FIG. 7) of the multi-layer mask is formed over the first middle layer of the multi-layer mask as described above with reference to FIG. 7. In step 2311, a top layer (such as the top layer 201D illustrated in FIG. 7) of the multi-layer mask is formed over the second middle layer of the multi-layer mask as described above with reference to FIG. 7.

In accordance with an embodiment, a method includes forming a multi-layer mask over a dielectric layer. Forming the multi-layer mask includes: forming a bottom layer over the dielectric layer; forming a first middle layer over the bottom layer, the first middle layer including a first silicon-containing material, the first silicon-containing material having a first content of Si—$CH_3$ bonds; and forming a second middle layer over the first middle layer, the second middle layer including a second silicon-containing material, the second silicon-containing material having a second content of Si—$CH_3$ bonds less than the first content of Si—$CH_3$ bonds.

In accordance with another embodiment, a method includes forming a multi-layer mask over a dielectric layer. Forming the multi-layer mask includes: depositing a bottom layer over the dielectric layer; depositing a first middle layer over the bottom layer, the first middle layer including a first silicon-containing material, the first silicon-containing material having a first content of Si—$CH_3$ bonds; performing a UV treatment on the first middle layer; depositing a second middle layer over the first middle layer, the second middle layer including a second silicon-containing material, the second silicon-containing material having a second content of Si—$CH_3$ bonds less than the first content of Si—$CH_3$ bonds; and depositing a top layer over the second middle layer.

In accordance with yet another embodiment, a method includes forming a multi-layer mask over a substrate. Forming the multi-layer mask includes depositing a first material over the substrate, the first material including C, H, O, or N; depositing a first SiOC material over the first material, the first SiOC material having a first content of Si—$CH_3$ bonds; performing a UV treatment on the first SiOC material; depositing a second SiOC material over the first SiOC material, the second SiOC material having a second content of Si—$CH_3$ bonds less than the first content of Si—$CH_3$ bonds; and depositing a photoresist material over the second SiOC material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a multi-layer mask over a dielectric layer, wherein forming the multi-layer mask comprises:
       forming a bottom layer over the dielectric layer;
       forming a first middle layer over the bottom layer, the first middle layer comprising a first silicon-containing material, the first silicon-containing material having a first content of Si—$CH_3$ bonds; and
       forming a second middle layer over the first middle layer, the second middle layer comprising a second silicon-containing material, the second silicon-containing material having a second content of Si—$CH_3$ bonds less than the first content of Si—$CH_3$ bonds.

2. The method of claim 1, wherein forming the multi-layer mask further comprises performing a UV treatment on the first middle layer.

3. The method of claim 2, wherein the UV treatment is performed in a gas atmosphere comprising $O_2$, Ar, He, NO, $N_2O$, $N_2O_2$, or a combination thereof.

4. The method of claim 1, wherein forming the multi-layer mask further comprises forming a top layer over the second middle layer.

5. The method of claim 1, wherein forming the first middle layer over the bottom layer comprises performing a plasma enhanced chemical vapor deposition (PECVD) process.

6. The method of claim 5, wherein performing the PECVD process comprises using a silicon-containing precursor comprising a $C_xH_y$ group.

7. The method of claim 6, wherein performing the PECVD process further comprises using a $C_xH_y$ precursor.

8. A method comprising:
    forming a multi-layer mask over a hard mask layer, wherein forming the multi-layer mask comprises:
       depositing a first layer over the hard mask layer, the first layer having a first content of Si—$CH_3$ bonds;
       performing a UV treatment on the first layer, the UV treatment increasing a hardness of the first layer;
       depositing a second layer over the first layer, the second layer having a second content of Si—$CH_3$ bonds less than the first content of Si—$CH_3$ bonds; and
       depositing a photoresist layer over the second layer.

9. The method of claim 8, wherein depositing the first layer over the hard mask layer comprises performing a plasma enhanced chemical vapor deposition (PECVD) process.

10. The method of claim 9, wherein performing the PECVD process comprises using $Si(CH_3)_4$, $Si(CH_3)_3H$, $Si(OC_2H_5)_4$, or $C_5H_{13}O_2Si$ as a silicon-containing precursor.

11. The method of claim 10, wherein performing the PECVD process comprises using $C_2H_2$, $C_3H_8$, $C_2H_6$, or $C_6H_6$ as a $C_xH_y$ precursor.

12. The method of claim 8, wherein the UV treatment is performed in a gas atmosphere comprising $O_2$, Ar, He, NO, $N_2O$, $N_2O_2$, or a combination thereof.

13. The method of claim 8, wherein depositing the first layer over the hard mask layer comprises performing an atomic layer deposition (ALD) process.

14. The method of claim 13, wherein performing the ALD process comprises using $SiH_2[N(C_2H_5)_2]_2$ as a silicon-containing precursor.

15. A method comprising:
    forming a multi-layer mask over a substrate, wherein forming the multi-layer mask comprises:
       depositing a first material over the substrate, the first material comprising C, H, O, or N;
       depositing a first SiOC material over the first material, the first SiOC material having a first content of Si—$CH_3$ bonds;

performing a UV treatment on the first SiOC material;

depositing a second SiOC material over the first SiOC material, the second SiOC material having a second content of Si—CH$_3$ bonds less than the first content of Si—CH$_3$ bonds; and depositing a photoresist material over the second SiOC material.

16. The method of claim 15, wherein the UV treatment reduces an etch rate of the first SiOC material.

17. The method of claim 15, wherein the first content of Si—CH$_3$ bonds is between about 0.5% to about 15%.

18. The method of claim 15, wherein the second content of Si—CH$_3$ bonds is less than about 0.5%.

19. The method of claim 15, wherein the UV treatment is performed using a UV radiation having a wavelength between about 150 nm and 400 nm.

20. The method of claim 15, wherein the first SiOC material further comprises Si—O and Si—C bonds.

* * * * *